(12) United States Patent
Nariai et al.

(10) Patent No.: US 7,815,872 B2
(45) Date of Patent: Oct. 19, 2010

(54) REACTOR FOR GENERATING MOISTURE AND MOISTURE GENERATING AND FEEDING APPARATUS FOR WHICH THE REACTOR IS EMPLOYED

(75) Inventors: Toshirou Nariai, Osaka (JP); Kouji Kawada, Osaka (JP); Keiji Hirao, Osaka (JP); Yukio Minami, Osaka (JP); Akihiro Morimoto, Osaka (JP); Nobukazu Ikeda, Osaka (JP)

(73) Assignee: Fujikin Incorporated, Osaka (JP)

( * ) Notice: Subject to any disclaimer, the term of this patent is extended or adjusted under 35 U.S.C. 154(b) by 914 days.

(21) Appl. No.: 11/570,667

(22) PCT Filed: Jul. 4, 2005

(86) PCT No.: PCT/JP2005/012329

§ 371 (c)(1),
(2), (4) Date: Dec. 14, 2006

(87) PCT Pub. No.: WO2006/008949

PCT Pub. Date: Jan. 26, 2006

(65) Prior Publication Data

US 2008/0241022 A1 Oct. 2, 2008

(30) Foreign Application Priority Data

Jul. 20, 2004 (JP) .............................. 2004-211129

(51) Int. Cl.
*B01J 8/02* (2006.01)
*C01B 5/00* (2006.01)
(52) U.S. Cl. ........................ 422/198; 422/199; 422/202; 422/211; 422/220; 423/580.1
(58) Field of Classification Search ........................ None
See application file for complete search history.

(56) References Cited

U.S. PATENT DOCUMENTS 6,919,056 B2    7/2005    Ohmi et al.

(Continued)

FOREIGN PATENT DOCUMENTS

JP        2000-72405 A    3/2000

(Continued)

OTHER PUBLICATIONS

International Search Report dated Oct. 4, 2005, in corresponding International Patent Application No. PCT/JP2005/012329, one page.

*Primary Examiner*—Jennifer A Leung
(74) *Attorney, Agent, or Firm*—Griffin & Szipl, P.C.

(57) ABSTRACT

A reactor for generating moisture, with which hydrogen and oxygen fed into the reactor contact with a platinum coating catalyst layer to activate reactivity so that hydrogen and oxygen react under conditions of non-combustion, wherein the reactor includes a cooler comprising a heat dissipation body substrate in which a heater insertion hole is made in the center to fix to the outer surface of the reactor structural component on the outlet side and a cooler on the outlet side made up of a plural number of heat dissipation bodies installed vertically in parallel on the part excluding the area where the afore-mentioned heater insertion hole of the heat dissipation body substrate exists, and a part of the heater to heat the reactor is inserted in the heater insertion hole so as to fix to the outer surface of the reactor structural component on the outlet side.

20 Claims, 23 Drawing Sheets

U.S. PATENT DOCUMENTS

| | | |
|---|---|---|
| 7,008,598 B2 | 3/2006 | Ohmi et al. |
| 7,258,845 B2 * | 8/2007 | Ohmi et al. ................. 422/211 |
| 7,368,092 B2 * | 5/2008 | Ohmi et al. ................. 422/198 |
| 7,553,459 B2 * | 6/2009 | Ohmi et al. ................. 422/187 |
| 2001/0048907 A1 * | 12/2001 | Ohmi et al. ............ 422/186.29 |
| 2002/0122758 A1 * | 9/2002 | Ohmi et al. ................. 422/211 |
| 2007/0231225 A1 * | 10/2007 | Ohmi et al. ................. 422/211 |

FOREIGN PATENT DOCUMENTS

| | | |
|---|---|---|
| JP | 2001-048501 A | 2/2001 |
| WO | 01-94254 A1 | 12/2001 |

* cited by examiner

PRIOR ART

REACTOR FOR GENERATING MOISTURE AND MOISTURE GENERATING AND FEEDING APPARATUS FOR WHICH THE REACTOR IS EMPLOYED

This is a National Phase Application in the United States of International Patent Application No. PCT/JP2005/012329 filed Jul. 4, 2005, which claims priority on Japanese Patent Application No. 2004-211129, filed Jul. 20, 2004. The entire disclosures of the above patent applications are hereby incorporated by reference.

FIELD OF THE INVENTION

The present invention is concerned with a reactor for generating moisture mainly used for semiconductor manufacturing facilities, and a moisture generating and feeding apparatus for which the radiator is employed. The present invention is used for generating and feeding moisture needed for oxide coatings of silicon, treatments to remove hydrogen discharged from a process chamber and the like.

BACKGROUND OF THE INVENTION

In semiconductor manufacturing facilities, a reactor for generating moisture with a structure as shown in FIG. 15 has been widely used. Namely, in FIG. 15, the following character references are used:
A Reactor
B Temperature regulator
$H_2$ Hydrogen gas
$O_2$ Oxygen gas
G Mixed gas
W Moisture gas
L Gap
V Interior space
α Inclination angle of the peripheral edge of a reflector
1 Reactor structural component on the inlet side
1a Gas feed port
2 Reactor structural component on the outlet side
2a Moisture gas take-out port
3a, 3b Reflectors
4 Reflector fixing bolt
5 Spacer
6 Platinum coating catalyst layer comprising a barrier coat 7 and a platinum coat 8 mounted on its outer surface
9 Barrier coat mounted on the inner surface of the reactor structural component on the inlet side
10 Barrier coat mounted on the outer surface of the reflector
11 Welded portion
12 Fixing hole for the sheath-type thermometer
13 Heater
15 Heater press
15 Cooler
15a Heat dissipation fin
15b Substrate A mixed gas G produced by mixing hydrogen gas $H_2$ and oxygen gas $O_2$ is fed from the gas feed port 1a to the interior space V, and when the gases contact with a platinum coating catalyst layer 6 mounted on the inner surface of the reactor structural component on the outlet side 2, the reactivity of the hydrogen and oxygen is activated by catalytic action. The activated hydrogen and oxygen react at the appropriate speed without causing an explosive combustion reaction within the atmosphere, below the combustion temperature of hydrogen, and the high purity moisture gas V produced flows out from the moisture take-out port 2a.

It may be necessary to raise the temperature of the interior space V of the reactor A higher than at least 200° C. in order that the afore-mentioned reactivity of the hydrogen and oxygen is activated and to maintain the stable reaction of both hydrogen and oxygen. To achieve this end, a plane-shaped heater 13 is provided on the outer side of the reactor structural component on the outlet side 2, and the reactor A is heated by the plane-shaped heater when the reactor A starts up. FIG. 16 shows the relationship between the temperature of the reactor A and the reaction rate of the hydrogen.oxygen. When the temperature of the reactor exceeds approximately 200° C., the reaction rate of the hydrogen.oxygen becomes the value of approximately 98% or more regardless of the mixture ratio of both hydrogen and oxygen.

While the reaction of the afore-mentioned hydrogen and oxygen proceeds, the reactor A is heated by the reaction heat, and then the reactor's temperature goes up. In order to restrain the afore-mentioned explosive combustion reaction of the hydrogen and oxygen, it is necessary that the temperature of the interior space V is held at a temperature lower (for example, 400~450° C.) than the lowest limit ignition temperature (approximately 560° C., and the limit ignition temperature goes up higher than 560° C. depending on the mixing ratio of hydrogen and oxygen) of the hydrogen gas (or hydrogen containing gas).

Accordingly, with this kind of conventional reactor for generating moisture, such measures as limiting the flow rate (namely, the volume of moisture gas W generated), improving the cooling performance of a cooler 15, or increasing the heat capacity of a reactor A, are implemented. When such measures as these are employed, it becomes possible to produce high purity moisture gas at the low cost, and stably and continuously with this kind of reactor for generating moisture. Thus, such reactors are widely and practically used.

However, in recent years there is seen a trend to downsize the apparatus for generating moisture while providing a bigger volume of moisture generation, which has been demanded in the field of semiconductor manufacturing facilities. For example, when the bore of a wafer becomes larger, the volume of moisture required for each treatment process increases. Accordingly, there has been a strong demand for more volume of moisture generation than that presently obtained by a conventional moisture generating apparatus having a dimensional volume similar to that of the conventional ones that are produced.

However, when downsizing of semiconductor manufacturing facilities is required, the moisture generating apparatus has to meet a severe restriction placed upon its volume/dimension. Because of this reason, it is nearly impossible for the cooling performance of the reactor A to be improved by means of upgrading the cooling fan though improvements such as making the heat dissipation fin 15a of the cooler 15 higher and increasing the number of heat dissipation fins slightly. Similarly, it is very difficult to upgrade a reactor A in view of the afore-mentioned restrictions on its volume. For example, the structurally allowable dimensions of a reactor A for generating moisture having a large flow rate of more than 10 SLM ("Standard Liter per Minute") are similar to the values of dimensions (outer diameter 228 mm, thickness 37 mm and height of a heat dissipation fin 25 mm) of the conventional reactor for generating moisture which has a maximum volume of moisture generation of 5 SLM.

Therefore, for a conventional reactor equipped with a cooler 15 provided with the structure shown in FIG. 15, there is no way at all to meet the requirement of increasing the volume of moisture generated in view of the restrictions in its volume/dimension including that volume/dimension of the cooler 15. Thus, a conventional reactor equipped with a cooler 15 fails to increase the volume of moisture that may be generated safely and easily.

Patent Document 1: TOKU-KAI No. 2001-48501
Patent Document: 2: INTERNATIONA DISCLOSURE WO-01/94254A

OBJECT OF THE INVENTION

It is an object of the present invention to solve the above-stated problems of the conventional reactor for generating moisture, namely, that the reactor cannot be upsized, and cooling performance cannot be enhanced significantly with the cooling fan 15, due to restrictions in the volume/dimension of the moisture generating apparatus, thus resulting in there being no way to increase the volume of moisture to be generated by the conventional reactor. It is another object of the present invention to provide a reactor for generating moisture that has made it possible to increase the volume of moisture to be generated using a reactor A, and having a similar volume, by making improvements in both the shape of the cooler 15 and the fixing structure of the cooler 15 to the reactor A so that heat dissipation from the reactor A is enhanced without increasing the volume/dimension of the cooler 15 significantly.

SUMMARY OF THE INVENTION

Inventors of the present invention have come to the idea of meeting the requirements to increase the volume of moisture to be generated by employing a reactor (outer diameter 228 mm, thickness 37 mm and height of a heat dissipation fin 25 mm) with a conventional structure, as shown in FIG. 15, to enhance cooling performance. Namely, only with some allowable structural modifications on the heat dissipation fin 15a without upsizing the cooling fan 18, structural modifications of the cooler 15 of the reactor A were tried, and tests were conducted principally aimed at suppressing the temperature of reactor A below about 450° C. during halts of the operation of the cooling fan 18.

Firstly, as shown in FIG. 17 to FIG. 20, one reactor A having a cooler 15 equipped with a 25 mm high heat dissipation fin 15a, and another reactor A having a cooler 15 equipped with a 60 mm high heat dissipation fin 15a, were manufactured, and cooling performance of coolers 15 equipped with the heat dissipation fins 15a with different heights was studied. In this case, the outer diameter and thickness of the reactor A were 228 mm φ and 37 mm, respectively. The total volume and total surface area of the heat dissipation fin 15a, as shown in FIG. 17, were 268 cm and 0.1984 cm² respectively, and the total volume and total surface area of the heat dissipation fin 15a shown in FIG. 19 were 548 cm and 0.4430 cm², respectively. Furthermore, slight improvements were made on a cooling fan 18 so that the air volume of 2.7 m/min in FIG. 17 was made to be 6.0 m/min in FIG. 19.

The height, 60 mm (in FIG. 19 and FIG. 20) of the afore-mentioned heat dissipation fin 15a has a value determined by the restrictions of the volume/dimension of the afore-mentioned reactor A. If the height of the heat dissipation fin 15a is made to be higher than 60 mm, the volume/dimension of the reactor A exceeds the limit value, and the more wattage that is required by the heater at the time moisture generation starts. Similarly, with regard to cooling fan 18, it is difficult to use a fan with a wind volume of 6.0 m/min or more because of the restrictions on displacement of the case body. Therefore, a fan with a wind volume of 6.0 m/min or less has been employed in the present invention.

FIG. 21 and FIG. 22 show the schematic outline of one example of the afore-mentioned moisture generating apparatus equipped with a reactor A of FIG. 19 and FIG. 20. Outer dimensions (the volume) have been set to be width 380 mm×depth 380 mm×height 533 mm. Also, as shown in FIG. 21 and FIG. 22, A designates a reactor, 15a designates a heat dissipation fin, 18 designates a cooling fan, and 17 designates a $H_2$ sensor. The fixing position of the cooling fan can be appropriately altered depending on the structure of the case body. For example, in the case shown in FIG. 21, it is placed on the front side.

FIG. 23 is a diagram showing the relationship between volume of the afore-mentioned moisture generated in the reactor A and the temperature of the reactor shown in FIG. 17 to FIG. 20. When the cooling fan 18 is set to off, the temperature of the reactor reaches 430° C. with the volume of moisture generated at 7 SLM (in case of a 25 mm high fin), and the temperature of the reactor reaches 420° C. with the volume of moisture generated of 8 SLM (in case of a 60 mm high fin). Even when the height of the cooling fin 15a is made to be the height of the allowable dimension limit (approx 60 mm), it was difficult at the time the fan halts to achieve a highest temperature of 450° C. or less and a volume of moisture generated of 10 SLM.

Inventors of the present invention have found, through analysis of the afore-mentioned test results in FIG. 23, that the reduction in the highest temperature of the reactor, due to the increase in the height of the heat dissipation fin 15a, is extremely low. In view of the above results, it has been learned that heat transfer characteristics from the reactor A to the heat dissipation fin 15a need to be improved in order to enhance natural heat dissipation from the heat dissipation fin 15a. Specifically, as shown in FIG. 15, when the reactor A is constituted so that a plane-shaped heater 13 is installed nearly over the front part of the outer surface of the reactor structural component on the outlet side 2, and a cooler 15 is fixed to its outside through the mediation of a heater press 14, the heat transfer from the reactor A to the cooler 15 is suppressed because of hard mica used to cover the plane-shaped heater 13 for its protection. Thus, it has become evident that the cooler 15 has not achieved its function sufficiently.

The present invention has been created with the knowledge as explained above. The plane-shaped heater 13 is inserted to the heat dissipation body substrate 15b of the cooler 15, and installed only on the center part of the reactor structural component on the outlet side 2, and the cooler 15 equipped with the heat dissipation fin is adhered only to the peripheral edge of the reactor A so that heat dissipation from the reactor A becomes possible efficiently.

The present invention, in accordance with a first embodiment, is fundamentally constituted so that it comprises a reactor having an interior space formed by combining a reactor structural component on the inlet side having a gas feed port and a reactor structural component on the outlet side having a moisture gas take-out port positioned against each other, a reflector placed oppositely to the gas feed port and moisture gas take-out port in the interior space of the afore-mentioned reactor, a platinum coating catalyst layer formed on the inner wall face of the afore-mentioned reactor structural component on the outlet side, a heater to heat the reactor, and a cooler fixed to the outer surface of the reactor to cool the reactor; and with the reactor for generating moisture to make hydrogen and oxygen react under conditions of non-combustion by allowing hydrogen and oxygen fed from the gas feed port into the interior space of the reactor to contact with the afore-mentioned platinum coating catalyst layer to activate the reactivity, the afore-mentioned cooler is made to be a cooler on the outlet side comprising a heat dissipation body substrate having a heater insertion hole in the center to fix to the outer surface of the reactor structural component on the outlet side, and a plural number of heat dissipation bodies installed vertically in parallel on the area excluding the part where the afore-mentioned heater insertion hole on the heat dissipation body substrate exists, and one part of the heater to heat the afore-mentioned reactor is inserted in the cooler on the outlet side, to fix the cooler to the outer surface of the reactor structural component on the outlet side.

The present invention, in accordance with a second embodiment, is fundamentally constituted so that it comprises a reactor having an interior space formed by combining a reactor structural component on the inlet side having a gas feed port and a reactor structural component on the outlet side having a moisture gas take-out port positioned against each other, a reflector placed oppositely to the gas feed port and moisture gas take-out port in the interior space of the afore-mentioned reactor, a platinum coating catalyst layer formed on the inner wall face of the afore-mentioned reactor structural component on the outlet side, a heater to heat the reactor, and a cooler fixed to the outer surface of the reactor to cool the reactor; and with the reactor for generating moisture to make hydrogen and oxygen react under conditions of non-combustion by allowing hydrogen and oxygen fed from the gas feed port into the interior space of the reactor to contact with the afore-mentioned platinum coating catalyst layer to activate the reactivity, the afore-mentioned cooler comprises a cooler on the outlet side and a cooler on the inlet side, and the afore-mentioned cooler on the outlet side comprises a heat dissipation body substrate having a heater insertion hole in the center to fix to the outer surface of the reactor structural component on the outlet side, and a plural number of heat dissipation bodies installed vertically in parallel on the area excluding the part where the afore-mentioned heater insertion hole on the heat dissipation body substrate exists, and the afore-mentioned cooler on the inlet side comprises a heat dissipation body substrate fixed to the outer surface of the reactor structural component on the inlet side and a plural number of heat dissipation bodies installed on the heat dissipation body substrate vertically in parallel.

The present invention, according to a third embodiment that further modifies the first embodiment and the second embodiment, is made so that a reactor structural component on the inlet side is provided with a heater.

The present invention, according to a fourth embodiment that further modifies the second embodiment, is made so that the height of the heat dissipation body of a cooler on the inlet side and the height of the heat dissipation body of a cooler on the outlet side are made to be the same or the height of the heat dissipation body of the cooler on the outlet side is made higher.

The present invention, according to a fifth embodiment that further modifies the second embodiment, is constituted so that a plane-shaped heater is provided between the heat dissipation body substrate of a cooler on the inlet side and the outer surface of the reactor structural component on the inlet side.

The present invention, according to a sixth embodiment that further modifies the second embodiment, is made so that the heat dissipation body substrate of the cooler on the inlet side is directly fixed to the outer surface of the inner part of the reactor structural component on the inlet side, and a brim-shaped heater is directly fixed to the outer surface of the outer part of the reactor structural component on the inlet side.

The present invention, according to a seventh embodiment that further modifies the second embodiment and the third embodiment, is made so that the heat dissipation body substrate of the cooler on the inlet side is fixed to the outer surface of the reactor structural component on the inlet side positioned at the inner side part of the heater press fixed to the outer surface of the reactor structural component on the inlet side, and a heater is fixed between the outer surface of the outside part of the reactor structural component on the inlet side and the heater press.

The present invention, according to an eighth embodiment that further modifies the first to seventh embodiments, is so made that the heat dissipation body substrate of the cooler on the outlet side is directly fixed to the outer surface of the outside part of the reactor structural component on the outlet side, and the heater is directly fixed to the reactor structural component on the outlet side by making the heater inserted into the heater insertion hole made on the cooler on the outlet side.

The present invention, according to a ninth embodiment that further modifies the first to eighth embodiments, is made so that a heat dissipation body is made to be a thin-plate-shaped heat dissipation fin or a rod-shaped heat dissipation pin.

The present invention, according to a tenth embodiment that further modifies the first to eighth embodiment, is made so that the outer surfaces of the reactor structural component on the inlet side and the reactor structural component on the outlet side are made to be round-shaped, and the heat dissipation body substrates of both coolers are made to be either round-shaped or square-shaped, and the heater insertion hole installed on the heat dissipation body substrate of the cooler on the outlet side is made to be round-shaped.

The present invention, according to an eleventh embodiment that further modifies the first embodiment and the second embodiment, is made so that the heater to heat a reactor is provided on the cylindrical face of the reactor.

The present invention, according to a twelfth embodiment that further modifies the first embodiment and the second embodiment, is made so that a heater is made to be brim-shaped. The present invention, according to a thirteenth embodiment, is fundamentally constituted so that a moisture generating and feeding apparatus is constituted by using a reactor for generating moisture according to the first embodiment of the invention.

EFFECTS OF THE INVENTION

The present invention is constituted so that a plate-shaped heater is directly fixed to the outer surface of the reactor structural component on the outlet side through the heater insertion hole made on the heat dissipation body substrate of the cooler on the outlet side, and a heat dissipation fin is installed only on the part excluding the afore-mentioned heater insertion hole of the heat dissipation body substrate of the cooler on the outlet side for cooling the reactor structural component on the outlet side. Accordingly, heat from the reactor structural component on the outlet side is directly transferred to the heat dissipation body substrate without passing through the plane-shaped heater, thus achieving substantial improvements in heat dissipation characteristics (cooling characteristics) compared to the case wherein the plane-shaped heater is installed between the heat dissipation body substrate and the reactor structural component on the outlet side. As a result, the present invention can generate moisture at approximately 2 times the amount of moisture generated conventionally and safely without reaching the temperature higher than about 400~450° C. while employing the small-sized reactor for generating moisture.

The start-up performance and ascending velocity of the moisture generating apparatus is improved because the plane-shaped heater of the reactor structural component on the outlet side is made in a manner such that the heat dissipation body substrate of the cooler on the outlet side does not contact with the outer surface side of the plane-shaped heater so that heat dissipation is reduced at the time of heating, thus efficiently making the reactor go up to the temperature of the start of reaction.

LIST OF REFERENCE CHARACTERS AND NUMERALS

Figure 1:
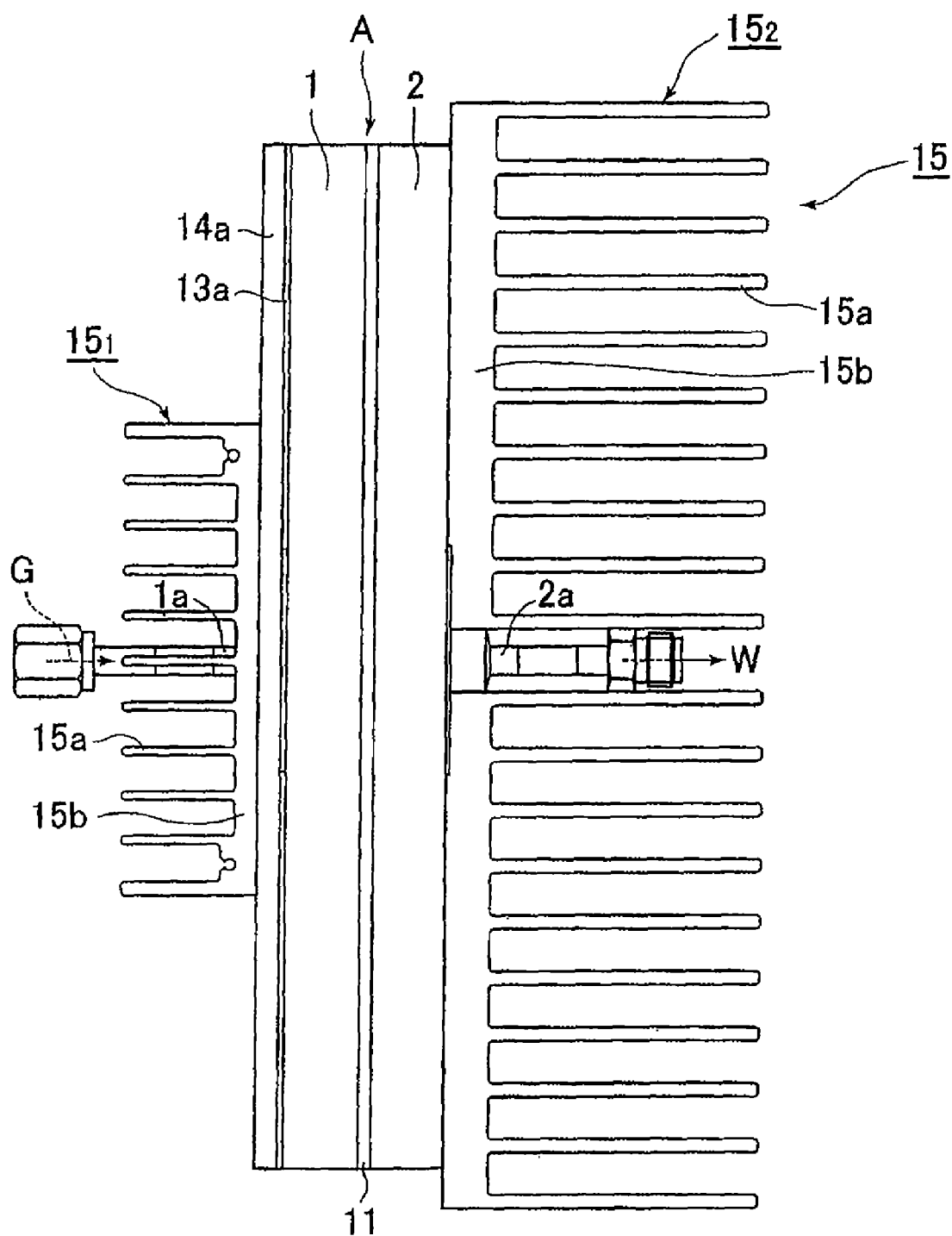
FIG. 1 is a front view of a reactor for generating moisture with regard to a first embodiment of the present invention.

A Reactor
B Temperature Regulator
$H_2$ Hydrogen gas
$O_2$ Oxygen gas
G Mixed gas
W Moisture gas
L Gap
V Interior space
α Inclination angle of the peripheral edge of a reactor
1 Reactor structural component on the inlet side
1a Gas feed port
2 Reactor structural component on the outlet side
2a Moisture gas take-out port
3a, 3b Reflectors
4 Reflector fixing bolt
5 Spacer
6 Platinum coating catalyst layer
7 Barrier coat
8 Platinum coat
9 Barrier coat mounted on the reactor structural component on the inlet side
10 Barrier coat mounted on the reflector
11 Welded portion
12 Fixing hole for the sheath-type thermometer
13 Plane-shaped heater
14 Heater press
15 Cooler
$15_1$ Cooler on the inlet side
$15_2$ Cooler on the outlet side
15a Heat dissipation fin
15b Heat dissipation body substrate (fin substrate)
23 Heater insertion hole
17 $H_2$ sensor
18 Cooling fan
19 Bolt (heater press bolt)
20 Bolt (bolt for the cooler fixing)
21 Fixing hole for the heater control thermometer
22 Fixing hole for the thermometer to monitor reactor's temperature
24 Mixer
25 Gas filter
26 Heater
27 Filter
28 Mixture gas take-out port
29 Lead wire for the heater
30 Case body

DETAILED DESCRIPTION AND BEST MODE FOR CARRYING OUT THE PRESENT INVENTION

The First Embodiment

Figure 2:
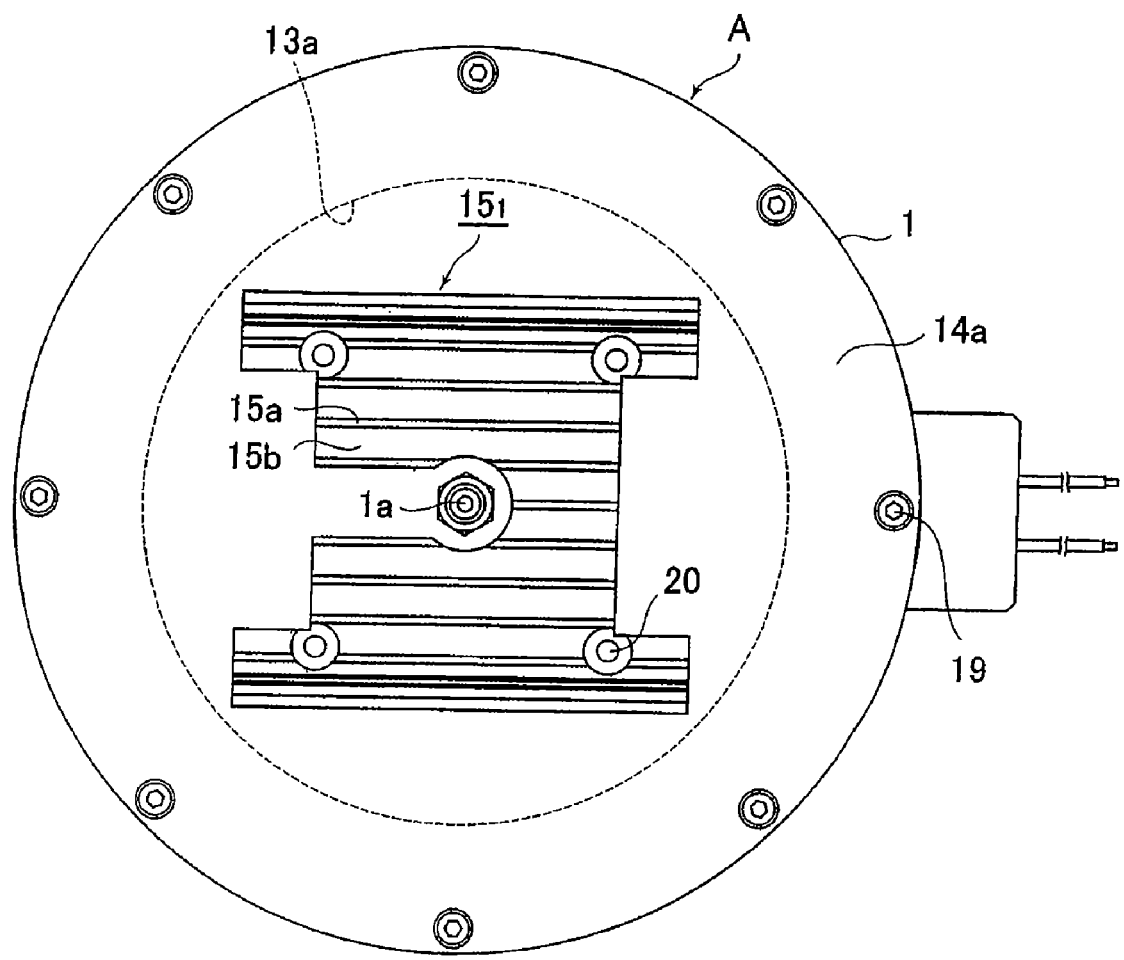
FIG. 2 is a side view of the inlet side, for raw material gas, of the reactor shown in FIG. 1.
Figure 3:
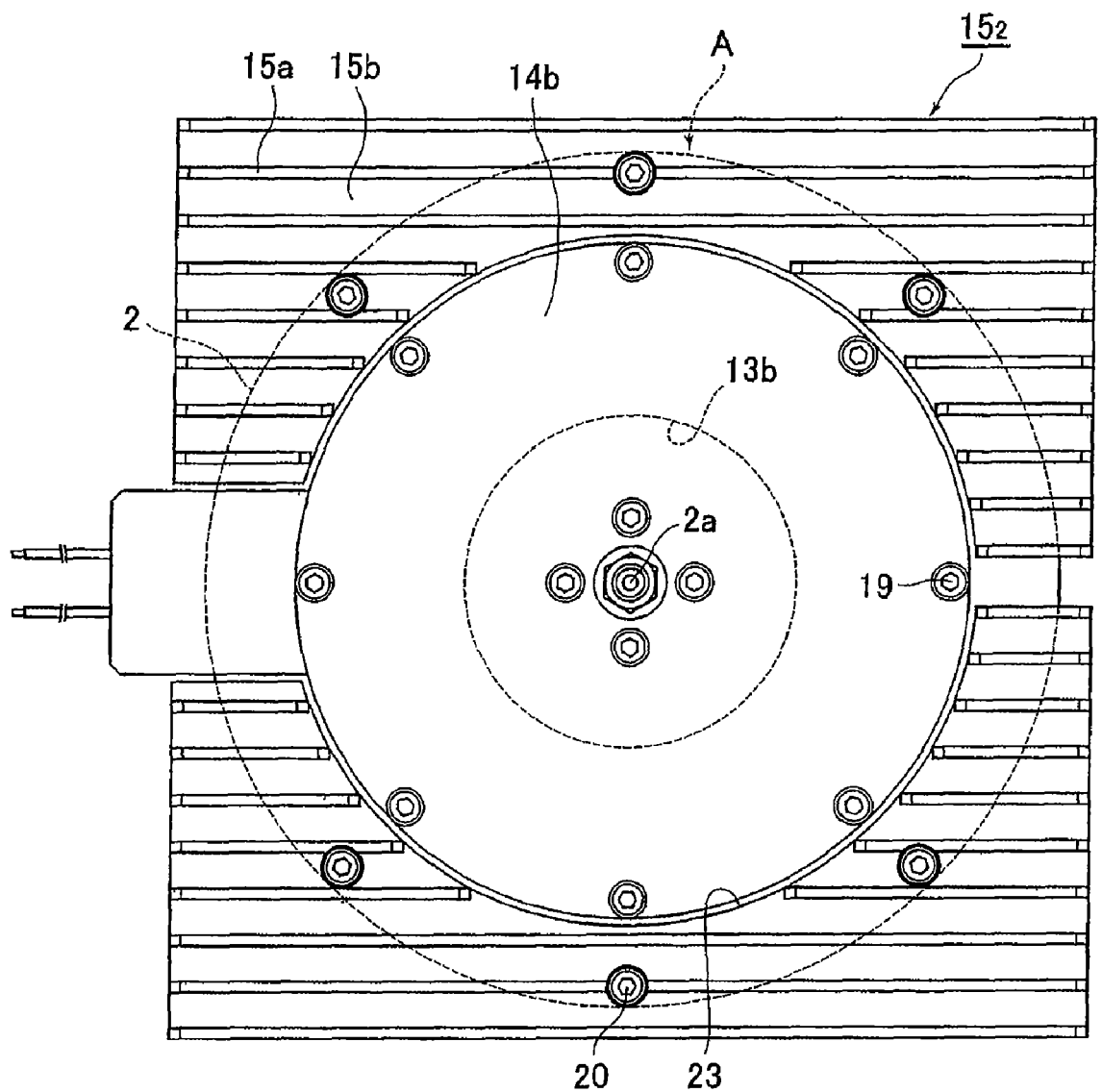
FIG. 3 is a side view of the outlet side, for the moisture gas, of the reactor shown in FIG. 1.
Figure 4:
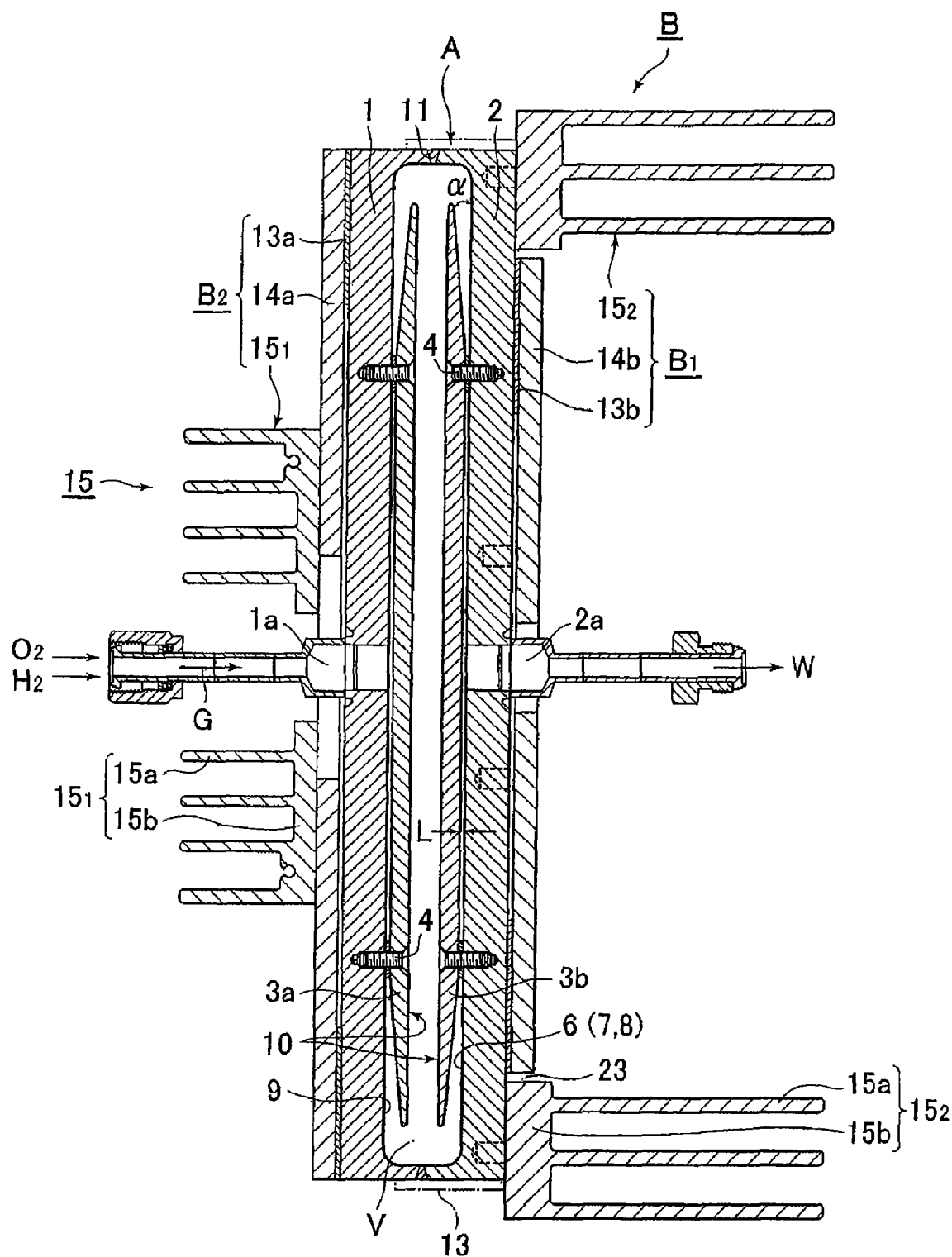
FIG. 4 is a longitudinal cross sectional view of the reactor shown in FIG. 1.

Embodiments of the present invention are described with reference to the drawings hereunder. FIG. 1 to FIG. 4 illustrate the first embodiment of the present invention. FIG. 1 is a front view of a reactor for generating moisture. FIG. 2 is a side view of the inlet side of the raw material gas. FIG. 3 is a side view of the outlet side of the moisture gas. FIG. 4 is a longitudinal cross sectional view of the reactor for generating moisture.

Referring to FIG. 1 to FIG. 4, a reactor for generating moisture A is formed in a round and hollow disc shape by combining a stainless steel (SUS316L) made reactor structural component on the inlet side 1 and reactor structural component on the outlet side 2 positioned against each other, and welding them hermetically. The afore-mentioned reactor structural component on the inlet side 1 is equipped with a round-shaped recess with a flat-shaped bottom therein, and a gas feed port 1a communicates with the inside of the recess. The reactor structural component on the outlet side 2 is equipped with a round-shaped recess with a flat-shaped bottom therein, and a moisture gas take-out port 2a communicates with the inside of the recess. Furthermore, flanges are formed inwardly on the peripheral edges of both reactor structural components 1, 2, and both flanges are positioned against each other and hermetically welded 11.

The centers of the round disc-shaped reflectors 3a, 3b are positioned against the gas feed port 1a and the moisture gas take-out port 2a of both reactor structural components 1, 2 respectively, and are fixed to both reactor structural components 1, 2 by using the fixing bolt 4 with a gap L located between the bottom faces of both reactor structural components. The stainless steel (SUS316L) made reflectors 3a, 3b are made so that their diameters are slightly smaller than the inner diameters of the round recesses.

As shown in FIG. 4, the peripheral edges of the reflectors 3a, 3b, positioned against both reactor structural components 1, 2, are finished to be tapered with an inclination angle α. The mixed gas G flowed in from the gas feed port 1a can flow out smoothly into the interior space V due to the inclination angle α; thus, flow in the gap between the reflector 3b and the reactor structural component on the outlet side 2 can prevent local and intensive heat liberation of the platinum coating catalyst layer 6 positioned against the peripheral edge of the reflector 3b.

The afore-mentioned platinum coating catalyst layer 6 is formed on the entire area of the inner surface of the SUS316 made reactor structural component on the outlet side 2. The platinum coating catalyst layer 6 is made up of a TiN-made barrier coat 7 and the platinum coat 8 formed thereon.

A TiN-made barrier coat 9 and barrier coat 10 are formed on the inner surface of the reactor structural component on the inlet side 1 and the outer surfaces the afore-mentioned reflectors 3a, 3b. The barrier coats 9, 10 are for preventing local heat liberation by means of the metal catalytic action on the surfaces of the reactor structural component on the inlet side 1 and on reflectors 3a, 3b.

The temperature regulator B of reactor A comprises a temperature regulator on the outlet side $B_1$ and a temperature regulator on the inlet side $B_2$. The afore-mentioned temperature regulator on the outlet side $B_1$ is made up of a brim-shaped heater 13b to heat the outer face side of the reactor structural component on the outlet side 2, a regulator (not illustrated) for the on-off control of the heater 13b, and a cooler on the outlet side $15_2$ to cool the reactor on the outlet side 2.

The temperature regulator on the inlet side $B_2$ is made up of a brim-shaped heater 13a, a regulator (not illustrated) for the on-off control of the heater 13a, and a cooler on the inlet side $15_1$ to cool the reactor on the inlet side 1.

The afore-mentioned brim-shaped heaters 13a, 13b, which are so-called thin-plate- and plane-shaped heaters, are attached to and fixed to the reactor structural components 1, 2 by means of the round-plate-shaped heater presses 14a, 14b. Specifically, as shown in FIG. 4, the brim-shaped heater on the outlet side 13b is shaped like a brim with a smaller outer diameter (180 mm φ with the present invention) than the outer diameter (228 mm φ) of the reactor structural component on the outlet side 2, and is directly fixed to the reactor structural component on the outlet side by a bolt 19 through the mediation of the round-shaped heater press 14b having the same diameter as that of the brim-shaped heater 13b. The brim-shaped heater on the outlet side 13b is installed only at the intermediate part of the reactor structural component on the outlet side 2, thus making it different from the afore-mentioned conventional example in FIG. 15.

On the other hand, the brim-shaped heater on the inlet side 13a is formed in a brim shape having nearly same outer diameter as that of the reactor structural component on the inlet side 1, and fixed to the reactor structural component on the inlet side 1 by a bolt 19 through the mediation of the round-shaped heater press 14a.

Figure 15:
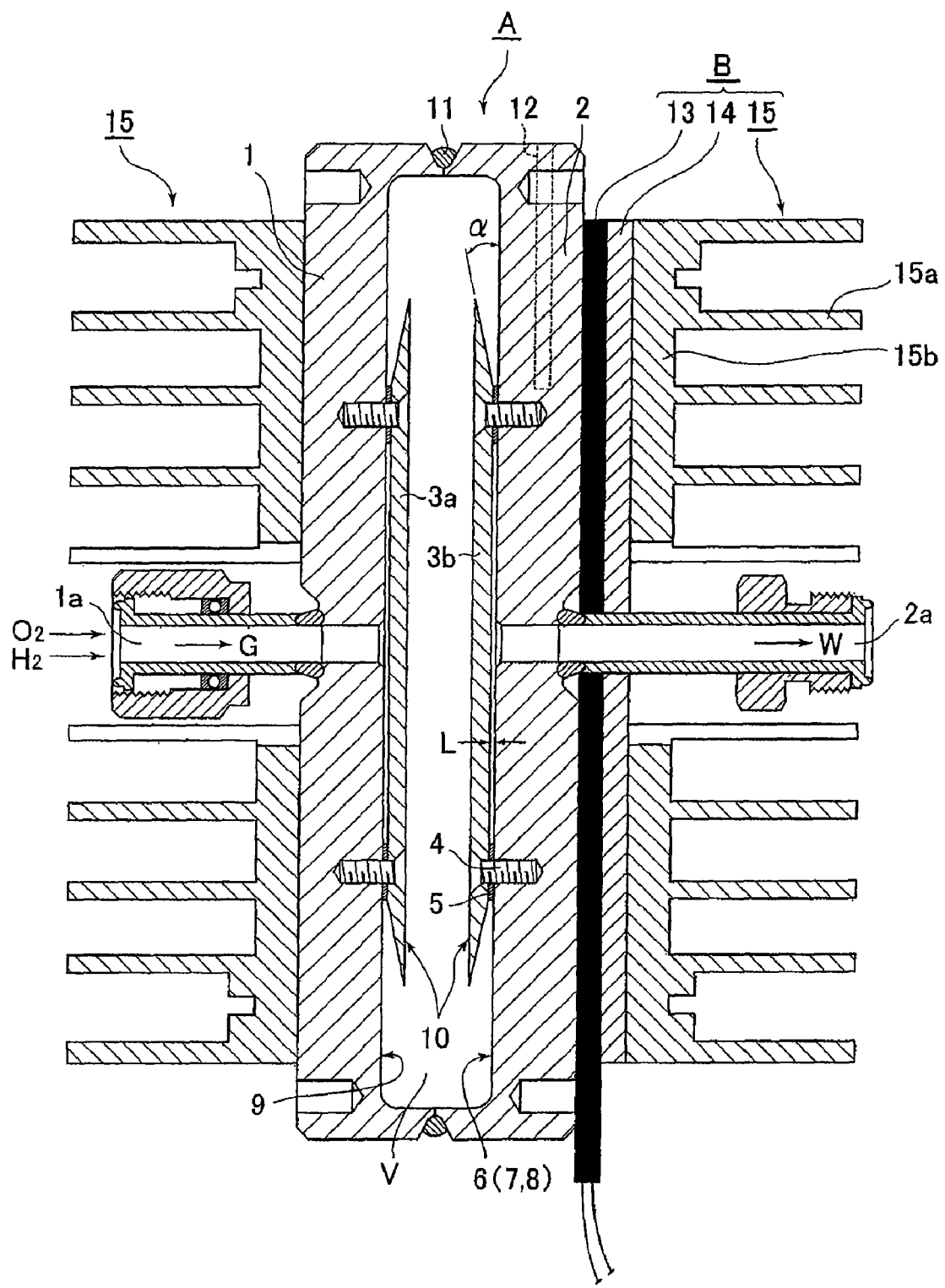
FIG. 15 is a longitudinal cross sectional view of a conventional reactor for generating moisture.
Figure 16:
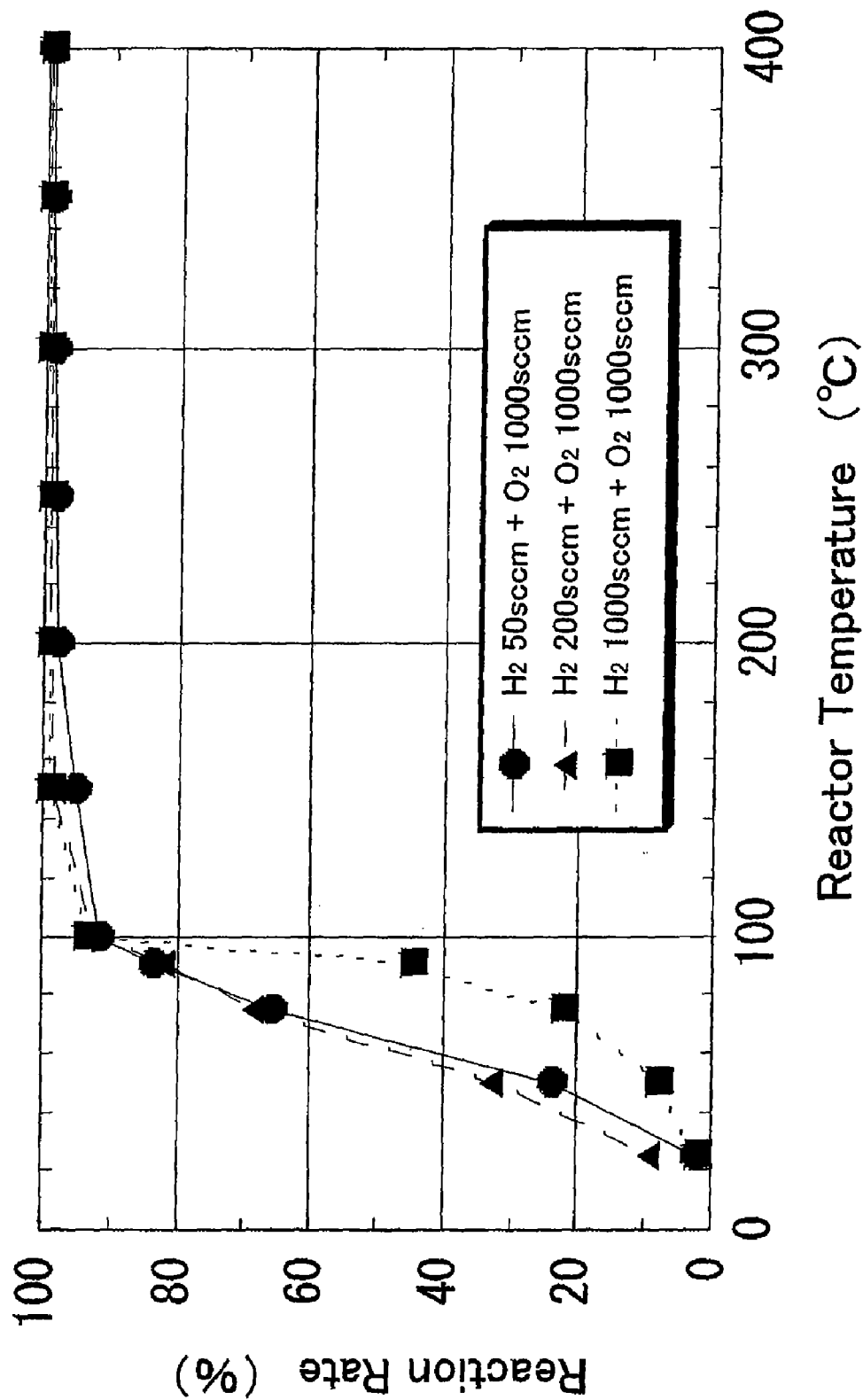
FIG. 16 is a diagram to show the relationship between the temperature of a reactor and the reaction rate of hydrogen.oxygen.
Figure 17:
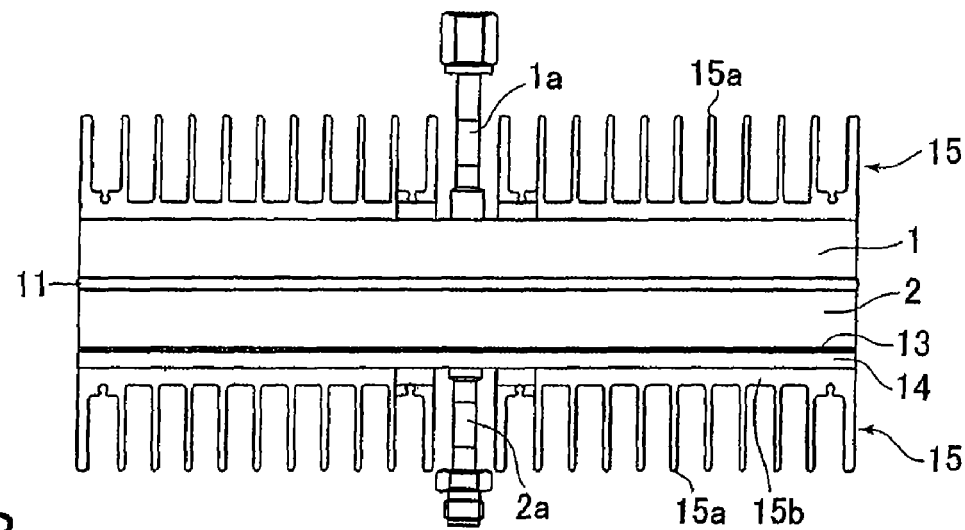
FIG. 17 is a schematic view of the reactor for testing.
Figure 18:
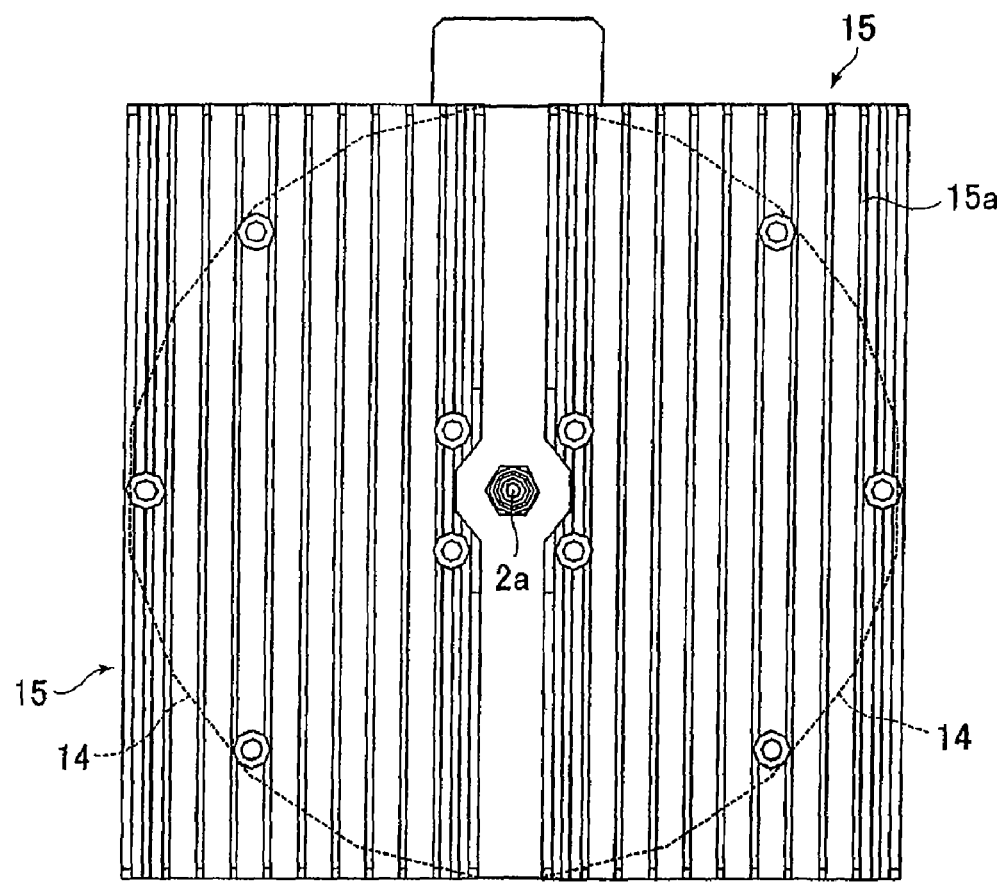
FIG. 18 is a side view of the outlet side of the reactor shown in FIG. 17.

The afore-mentioned cooler 15 comprises a cooler $15_1$ on the inlet side adhered to the outer surface of the reactor structural component on the inlet side 1 and a cooler $15_2$ on the outlet side adhered to the outer surface of the reactor structural component on the outlet side 2. The cooler $15_1$ on the inlet side is formed to be a square-shaped cooler as an integral unit with a 25 mm high heat dissipation fin 15a and an approximately 5 mm thick fin substrate (heat dissipation body substrate) 15b as shown in FIG. 15, and is fixed to the position corresponding inwardly to the brim-shaped heater 13a by a bolt 20.

As shown in FIG. 3 and FIG. 4, the cooler $15_2$ on the outlet side, provided on the side of the reactor structural component on the outlet side 2, is made up of a heat dissipation body substrate 15b on which a heater insertion hole 23 having an inner diameter of 190 mm is made in the center of the square-shaped heat dissipation body substrate, and a plural number of the 60 mm high thin-plate-shaped heat dissipation fins 15a, made like the teeth of a comb, are disposed on the heat dissipation body substrate 15b. In this embodiment, the cooler $15_2$ is made as an integral unit fabricated with an aluminum alloy made heat dissipation body substrate 15b (approx 10 mm thick) and heat dissipation fins 15a (approx 2 mm thick, 60 mm high) are employed.

In FIG. 1 to FIG. 4, a thin-plate-shaped heat dissipation fin 15a is utilized as the heat dissipation body. However, it goes without saying that a heat dissipation body of any shape can be used. For example, a rod-shaped heat dissipation pin can be used. Also, it goes without saying that although a square-shaped heat dissipation body substrate 15b is employed in the present embodiment for the cooler $15_2$ on the outlet side and the cooler $15_1$ on the inlet side, the shape employed could be a round one or the like.

Figure 5:
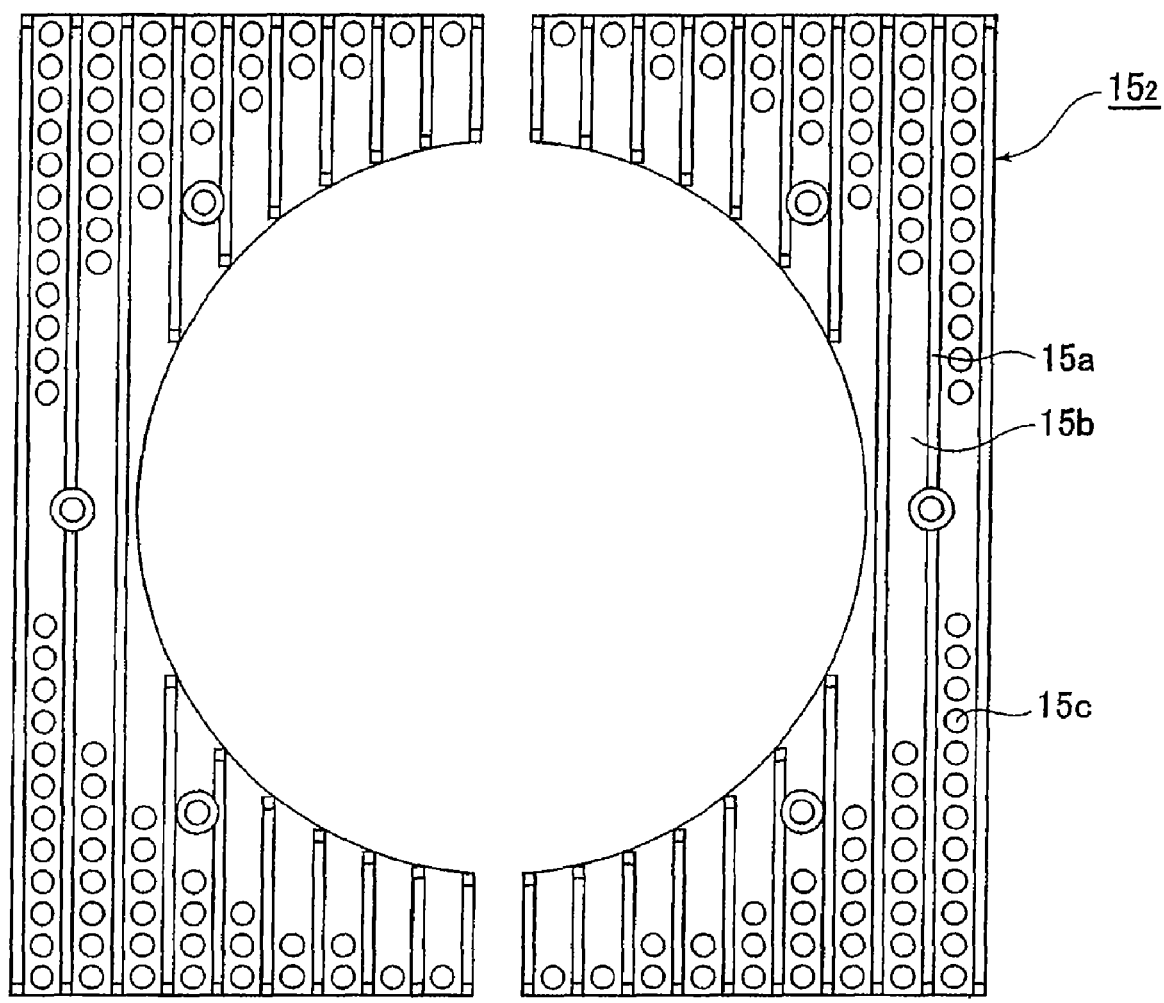
FIG. 5 shows another example of a cooler on the outlet side, for the moisture gas, of the reactor shown in FIG. 1.

Furthermore, as shown in FIG. 5, it is desirable that the afore-mentioned cooler $15_2$ on the outlet side is provided with a plural number (78 pcs.×2=156 pcs.) of through holes 15c, having a diameter of approximately 6 mm φ on the area where the heat dissipation fin 15a of the afore-mentioned heat dissipation body substrate 15b is not installed, to improve the permeability performance at the time when the cooling fan 18 is operated as well as to increase the cooling area so that the cooling performance of the cooler $15_2$ is enhanced.

Figure 19:
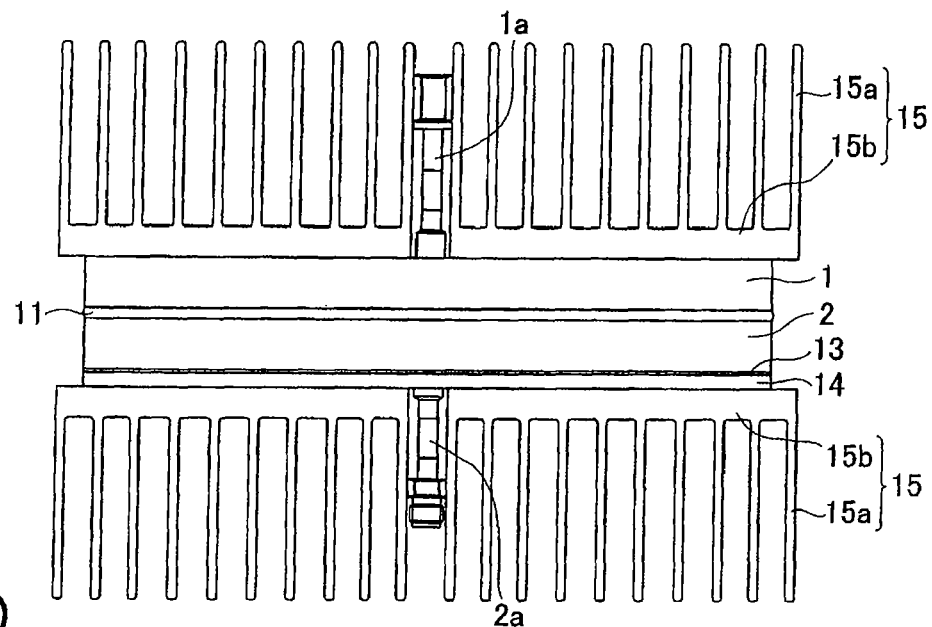
FIG. 19 is a schematic view of another reactor for testing.
Figure 20:
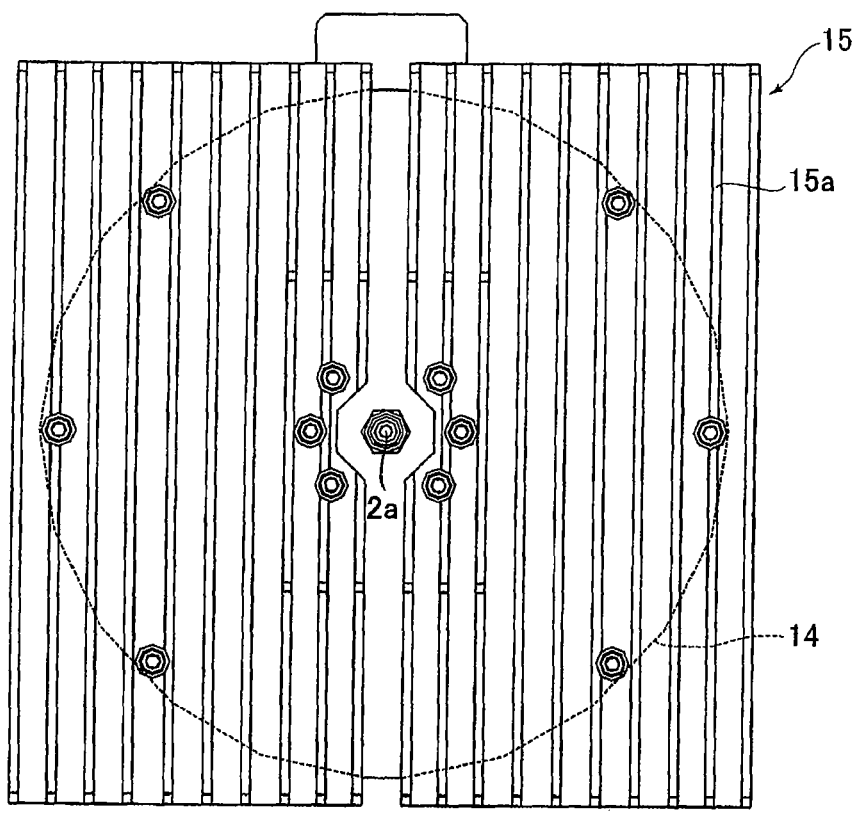
FIG. 20 is a side view of the outlet side of the reactor shown in FIG. 19.

With respect to FIG. 2 and FIG. 3, 19 designates a fixing bolt of the heater press 14 and 20 designates a fixing bolt of the cooler 15. According to the present embodiment, though the height of the heat dissipation fins 15a of the cooler $15_1$ on the inlet side is made to be 25 mm, it can be made to be 60 mm, which is the same as that of the cooler $15_2$ on the outlet side. Furthermore, according to the present embodiment, though it is constituted so that a brim-shaped heater 13a is installed on the reactor structural component on the inlet side 1, it can be constituted so that a brim-shaped heater 13a is not installed on the reactor structural component on the inlet side 1.

Before the moisture gas is generated, it is normal that the $N_2$ gas is fed into the reactor A and a purge treatment is conducted in the reactor A. At this time, the peripheral part of the reactor A is cooled with the afore-mentioned purge gas. Therefore, the reaction rate of moisture generation when moisture starts being generated is lowered, thus increasing the amount of non-reacted gas unless the peripheral part of the reactor A is heated to raise the temperature. The afore-mentioned brim-shaped heater 13a is utilized to prevent cooling due to purge gas and those associated problems. Heater 13a is, therefore, operated when the peripheral part of the reactor A needs mainly to be heated to raise the temperature. According to the present embodiment, though it is constituted so that a brim-shaped heater 13a is installed on the reactor structural component on the inlet side 1, it is also possible that a plane-shaped heater 13 is installed on the cylindrical face (cylinder-shaped peripheral face side) of the reactor A.

Example 1

According to FIG. 1 to FIG. 4, the reactor A has an outer diameter and thickness of 228 mm φ and 37 mm, respectively; the interior space V has the thickness and inner diameter of 17 mm and 216 mm φ, respectively; the reflectors 3a, 3b have a thickness and outer form of 3 mm and 204 mm φ, respectively; the gap L with the reactor structural component on the outlet side 2 is 1 mm and the gap L with the reactor structural component on the inlet side 1 is 1 mm; the length of the tapered face is approximately 21 mm (inclination angle α=8°); a platinum coating catalyst layer 6 is 0.8 μm (TiN barrier coat 7=5 μm+pt coat 8=0.3 μm); and the barrier coats 9, 10 of the inner wall face of the reactor structural component on the inlet side 1 and of the outer surface of the reflectors 3a, 3b are TiN (5 μm), respectively.

Also, reactor A is made so that the heat dissipation body substrate 15b of the cooler 15 has the external dimensions and thickness of 235 mm×235 mm and 10 mm, respectively; the inner diameter of the heater insertion hole 23 of the cooler on the outlet side $15_2$ is 190 mm φ; the height of the heat dissipation fin 15a is 60 mm; the height of the heat dissipation fin 15a of the cooler on the inlet side $15_1$ is 25 mm; and the thickness of the fin is 1.8 mm. Furthermore, the outer diameter of the brim-shaped heater 13b is made to be 180 mm φ (the thin plate- and plane-shaped heater 1 mm thick).

After reactor A was heated to approximately 300~350° C. by the plane-shaped heater 13, the mixed gas including $O_2$ and $H_2$ ($O_2$=10 l/min and $H_2$=10 l/min) was fed into the interior space V from the gas feed port 1a to generate moisture, and the temperature distribution, in a radial direction of the reactor structural component 2 at the position of 1.5 mm inwardly from the platinum coating catalyst layer 6 of the reactor structural component on the outlet side 2, was measured using a temperature detector inserted into, and fixed to, the reactor structural component on the outlet side 2.

Figure 6:
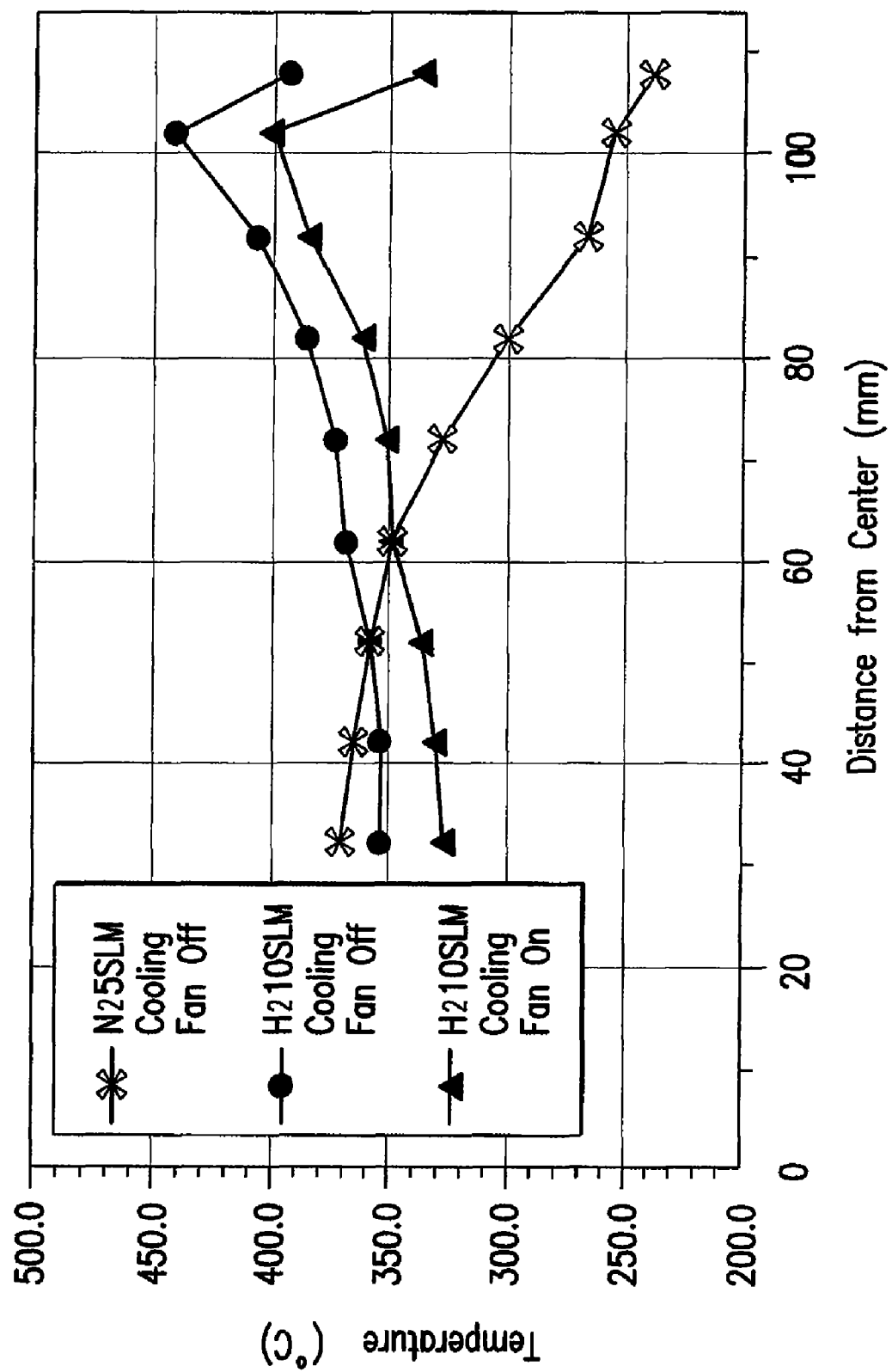
FIG. 6 shows the temperature distribution (radial) in close proximity to the inner wall of the reactor structural component on the outlet side 2 of a reactor for generating moisture with regard to Example 1 in FIG. 1 to FIG. 4.

At the time of measurement, the cooling fan 18 of the temperature regulator B was brought to a halt, and the temperature of the brim-shaped heater 13a was set at 350° C. FIG. 6 illustrates the results of the measurement. The test results reveal that the temperature (maximum temperature part) of the reactor structural component on the downstream side 2, in the vicinity of the periphery of the reflector 3b under conditions that the volume of moisture generated is 10 SLM, can be suppressed approximately to 440° C.

The Second Embodiment

Figure 7:
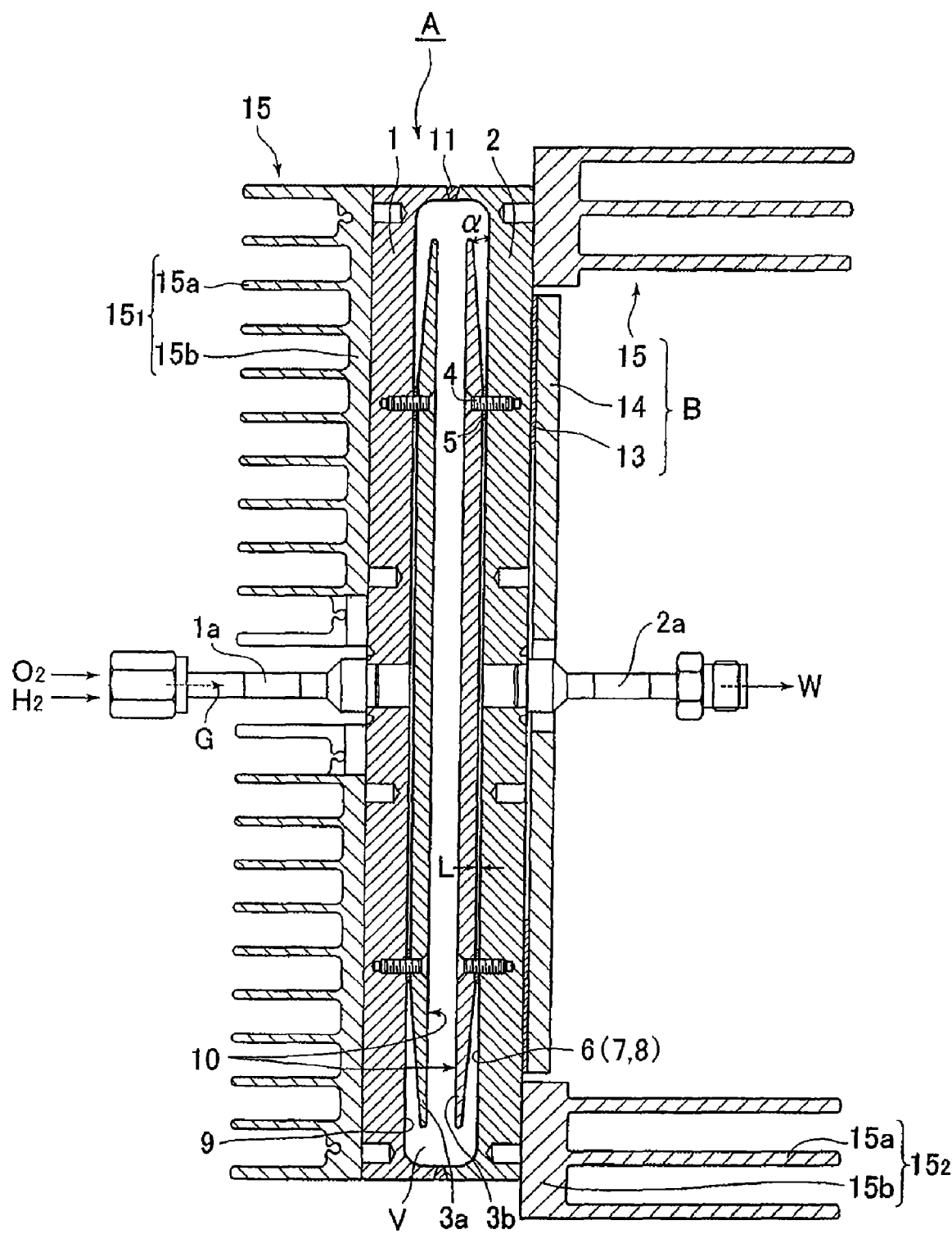
FIG. 7 is a longitudinal cross sectional view of a reactor for generating moisture with respect to an other embodiment of the present invention.
Figure 8:
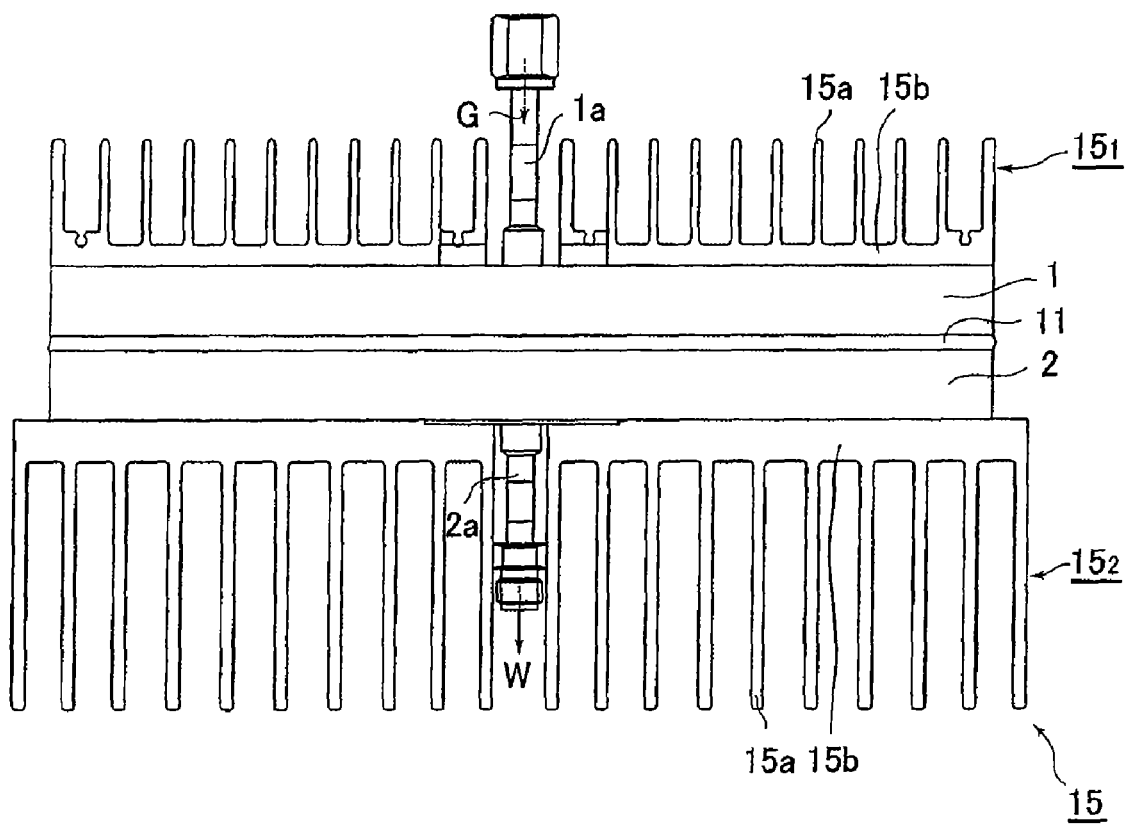
FIG. 8 is a plan view of the reactor shown in FIG. 7.

FIG. 7 is a longitudinal cross sectional view of the reactor for generating moisture with regard to a second embodiment of the present invention. FIG. 8 is its plan view, and FIG. 9 is a side view of the right side of the second embodiment.

Figure 9:
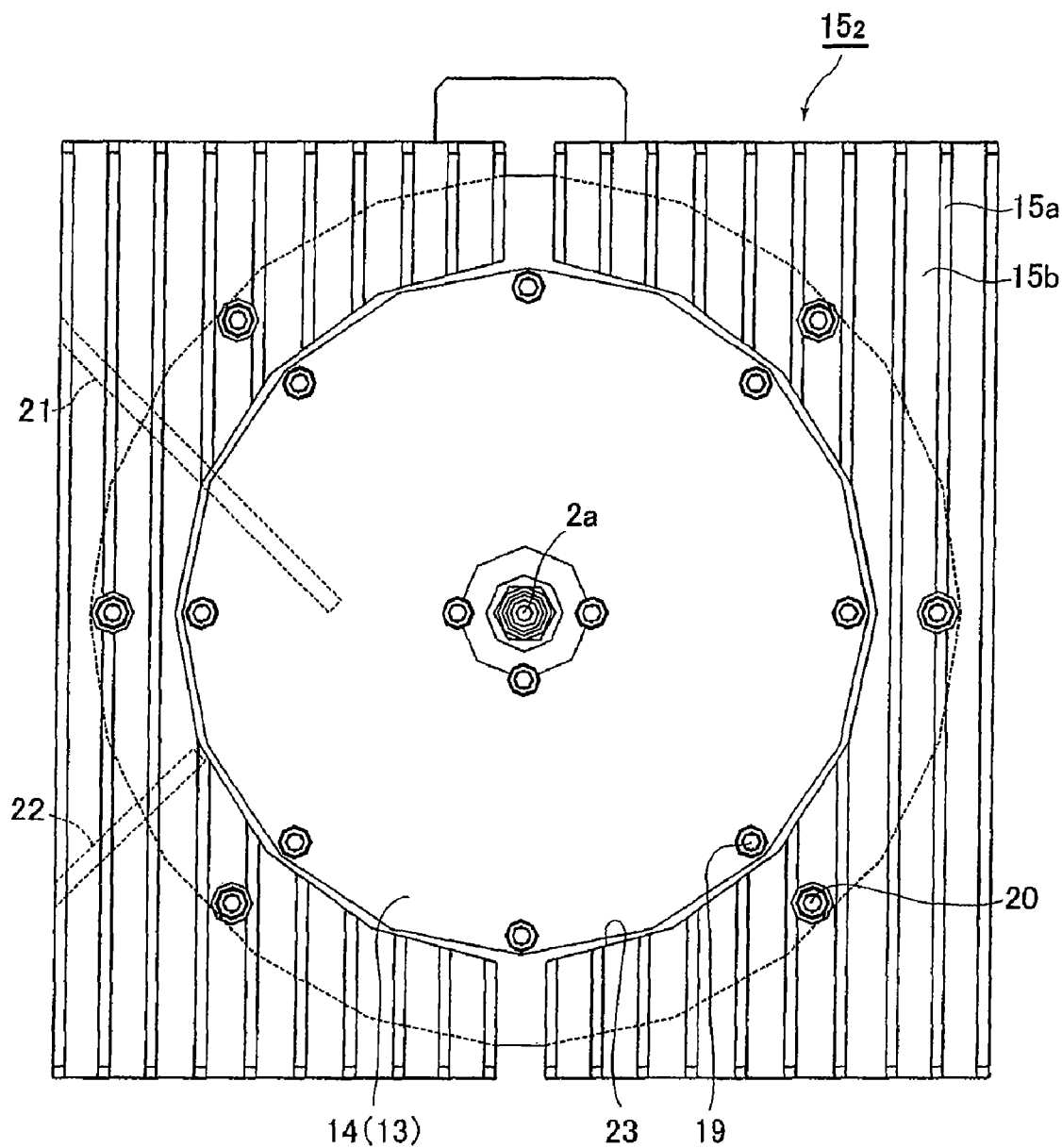
FIG. 9 is a side view of the right side of the reactor shown in FIG. 8.

Referring to FIG. 7 to FIG. 9, a reactor A for generating moisture is formed in a round and hollow disc shape by combining a stainless steel (SUS316L) made reactor structural component on the inlet side 1 and reactor structural component on the outlet side 2 positioned against each other and welding them hermetically. The afore-mentioned reactor structural component on the inlet side 1 is equipped with a round-shaped recess with a flat-shaped bottom therein, and a gas feed port 1a communicates with the inside of the recess. The reactor structural component on the outlet side 2 is equipped with a round-shaped recess with a flat-shaped bottom therein, and a moisture gas take-out port 2a communicates with the inside of the recess. Furthermore, flanges are formed inwardly on the peripheral edges of both reactor structural components 1 and 2, and both flanges are positioned against each other and hermetically welded 11.

The centers of the round-shaped reflectors 3a, 3b are positioned against the gas feed port 1a and the moisture gas take-out port 2a of both reactor structural components 1 and 2, respectively, and are fixed to both reactor structural components 1 and 2 using a fixing bolt 4 with a gap L located between the bottom faces of both reactor structural components by means of a spacer 5. The stainless steel (SUS316L) made reflectors 3a, 3b are made so that their diameters are slightly smaller than the inner diameters of the round recesses. As shown in FIG. 7, the peripheral edges, positioned against both reactor structural components 1, 2, of the reflectors 3a, 3b are finished to have a taper with an inclination angle α. The mixed gas G flowing in from the gas feed port 1a can flow out smoothly into the interior space V due to the inclination angle α, and flow in the gap between the reflector 3b and the reactor structural component on the outlet side 2 occurs such that local and intensive heat liberation of the platinum coating catalyst layer 6 positioned against the peripheral edge of the reflector 3b can be prevented.

The afore-mentioned platinum coating catalyst layer 6 is formed on the entire area of the inner surface of the SUS316L made reactor structural component on the outlet side 2 (excluding the area in the vicinity of the part which the spacer 6 makes a contact with the inner surface). The platinum coating catalyst layer 6 is made up of the TiN-made barrier coat 7 formed on the inner surface of the reactor 2 and the platinum coat 8 formed thereon.

The TiN-made barrier coat 9 and barrier coat 10 are formed on the inner surface of the reactor structural component on the inlet side 1 and on the outer surfaces of the afore-mentioned reflectors 3a, 3b. The barrier coats 9, 10 are for preventing local heat liberation by means of the metal catalytic action on the surfaces of the reactor structural component on the inlet side 1 and on reflectors 3a, 3b.

The temperature regulator B of reactor A comprises a plane-shaped heater 13 disposed to heat the outer side of the reactor structural component on the outlet side 2, a regulator (not illustrated) for on-off control of the plane-shaped heater 13, and a cooler 15 to cool the reactor A. The afore-mentioned plane-shaped heater 13 is a so-called thin-plate- and plane-shaped heater, and in this example, formed in the shape of a brim. The plane-shaped heater 13 is attached to, and fixed to, the reactor structural component on the outlet side 2 by means of the round-shaped heater press 14. Specifically, as shown in FIG. 9, the plane-shaped heater 13 is formed in a round shape having an outer diameter (180 mm φ with the present embodiment) that is smaller than the outer diameter (228 mm φ) of the reactor structural component on the outlet side 2, and the heater 13 is fixed directly to the reactor structural component on the outlet side by a bolt 19 through the mediation of the round-shaped heater press 14 that is provided with the same diameter as that of the plane-shaped heater 13. The plane-shaped heater 13 is installed only on the center part of the reactor structural component on the outlet side 2. Therefore, the present embodiment is different from the afore-mentioned conventional example shown in FIG. 15.

The afore-mentioned cooler 15 comprises a cooler $15_1$ on the inlet side adhered to the outer surface of the reactor structural component on the inlet side 1 and a cooler $15_2$ on the outlet side adhered to the outer surface of the reactor structural component on the outlet side 2. The cooler $15_1$ on the inlet side is formed to be a square-shaped integral unit with a 25 mm high heat dissipation fin 15a and an approximately 5 mm thick fin substrate 15b as shown in FIG. 15.

As shown in FIG. 8 and FIG. 9, the cooler $15_2$ on the outlet side is provided on the side of the reactor structural component on the outlet side 2 and is made up of a heat dissipation body substrate 15b, on which a heater insertion hole 23 having an inner diameter of 190 mm is made in the center of the square-shaped heat dissipation body substrate, and a plural number of 60 mm high thin-plate-shaped heat dissipation fins 15a. The 60 mm high thin-plate-shaped heat dissipation fins 15a are made like the teeth of a comb on the heat dissipation body substrate 15b except for the round-shaped hole. According to the present embodiment, a cooler 15 is employed that is made as an integral unit fabricated with an aluminum alloy made heat dissipation body substrate 15b (approx 10 mm thick) and heat dissipation fins 15a (approx 2 mm thick and 60 mm high). According to FIG. 7 to FIG. 9, a thin-plate-shaped heat dissipation fin 15a is utilized as a heat dissipation body. However, it goes without saying that heat dissipation device of any shape can be used. For example, a rod-shaped heat dissipation pin can be used. Also, it goes without saying that although a square-shaped heat dissipation body substrate is employed in this embodiment for the second cooler $15_2$ and the cooler $15_1$ on the inlet side, the shape could be a round one or the like.

In FIG. 9, 20 designates a fixing bolt for the cooler 15, 21 designates a fixing hole for the heater control thermometer and 22 designates a fixing hole for the thermometer to monitor the reactor's temperature. According to the present embodiment, although the height of the heat dissipation fin of the cooler $15_1$ on the inlet side is made to be 25 mm, it can be made to be 60 mm in height, which is the same as that of the cooler $15_2$ on the outlet side. Furthermore, according to the present embodiment, although the reactor A is constituted so that a heater is not installed on the side of the reactor structural component on the inlet side 1, the reactor can be so constituted such that a heater can be installed also on the reactor structural component on the inlet side 1.

According to the afore-mentioned embodiment shown in FIG. 7 to FIG. 9, the area of the heat dissipation body substrate 15b of the cooler $15_1$ on the inlet side is made to be about the same as that of the outer surface of the reactor structural component on the inlet side 1. However, it is possible that the reactor A is constituted so that the area of the heat dissipation body substrate 15b of the cooler $15_1$ on the inlet side is made smaller, and the heat dissipation body substrate 15b is fixed to the inside part (specifically, the center part) of the reactor structural component on the inlet side 1 so that the inside part of the reactor structural component on the inlet side 1 is mainly cooled, and the brim-shaped heater is directly fixed to the outside of the outer surface of the reactor structural component on the inlet side 1 so that only the peripheral edge of the reactor structural component on the inlet side is heated by the brim-shaped heater.

Figure 10:
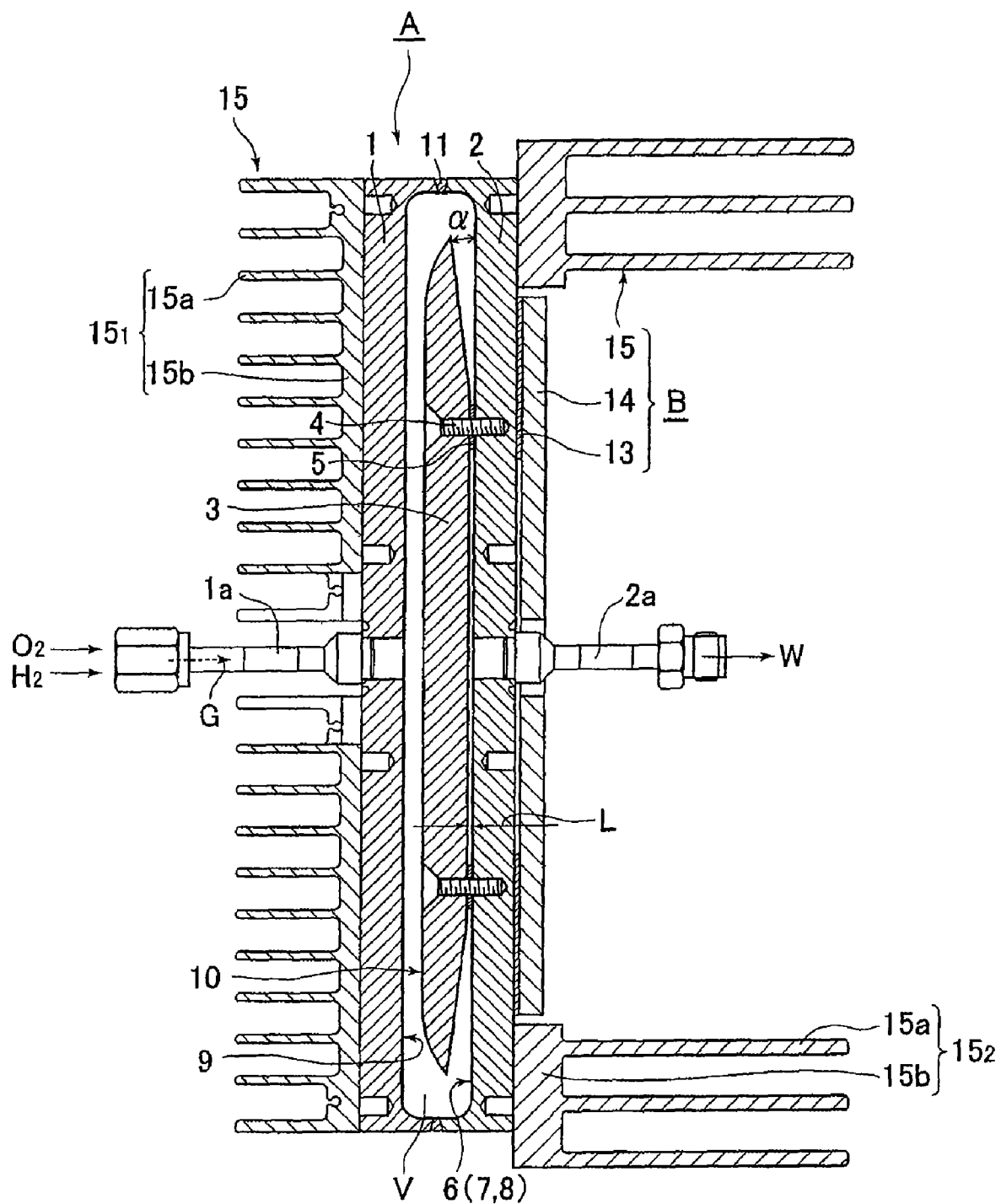
FIG. 10 is a longitudinal cross sectional view illustrating another embodiment of a reactor for generating moisture of the present invention.

Furthermore, according to the afore-mentioned embodiment in FIG. 7 to FIG. 9, 2 pieces of reflector 3a, 3b are installed inside the reactor A. However, it is possible that reactor A may be constituted so that one reflector 3 is installed to make the gas feed port 1a and moisture gas take-out port 2a positioned against each other as shown in FIG. 10. In FIG. 10, the constitution of reactor A is the same as that in FIG. 7 except for the part corresponding to the reflector 3.

Example 2

In FIG. 7 to FIG. 9, the outer diameter of the reactor A was made to be 228 mm φ; its thickness is 37 mm; the thickness of an interior space V is 17 mm; the inner diameter is 216 mm φ; the thickness of reflectors 3a, 3b is 3 mm; the outer form is 204 mm φ; the gap L with the reactor structural component on the outlet side 2 is 1 mm; the gap with the reactor structural component on the inlet side 1 is 1 mm; the length of the tapered face approx 21 mm (inclination angle=8°); a platinum coating catalyst layer 6 is 5.3 μm (TiN barrier coat 7=5 μm+pt coat 8=0.3 μm), and the barrier coats 9, 10 of the inner wall face of the reactor structural component on the inlet side 1 and the outer surface of reflectors 3a, 3b are TiN of 5 μm, respectively.

External dimensions of the heat dissipation body substrate 15b of the cooler $15_1$ on the inlet side and the cooler $15_2$ on the outlet side were made to be 235 mm×234 mm; its thickness is 10 mm; the inner diameter of the heater insertion hole 23 of the cooler on the outlet side $15_2$ is 190 mm φ; the height of the heat dissipation fins 15a are 60 mm; the height of the heat dissipation fins 15a of the cooler $15_1$ on the inlet side are 25 mm; and the thickness of the fin is 1.8 mm. Furthermore, the outer diameter of the plane-shaped heater was made to be 180 mm φ (thin-plate- and plane-shaped heater, 1 mm thick). The fixing hole 22 for the thermometer used to monitor the temperature of the reactor was installed in a position of 1.5 mm inwardly from the inner surface of the reactor structural component on the outlet side 2.

After reactor A was heated to approximately 300~350° C. with a plane-shaped heater 13, the gas mixed including $O_2$ and $H_2$ ($O_2$=10 l/min (fixed), $H_2$=10 l/min (variable)) was fed into the interior space V from the gas feed port 1a with free adjustment of the flow rate to generate moisture, and the temperature distribution in a radial direction of the reactor structural component 2, at the position of 1.5 mm inwardly from the platinum coating catalyst layer 6 of the reactor structural component on the outlet side 2, was measured using a temperature detector inserted into, and fixed to, the reactor structural component on the outlet side 2 making volume of moisture generated (specifically, the feeding volume of the mixed gas G) as a parameter.

Figure 11:
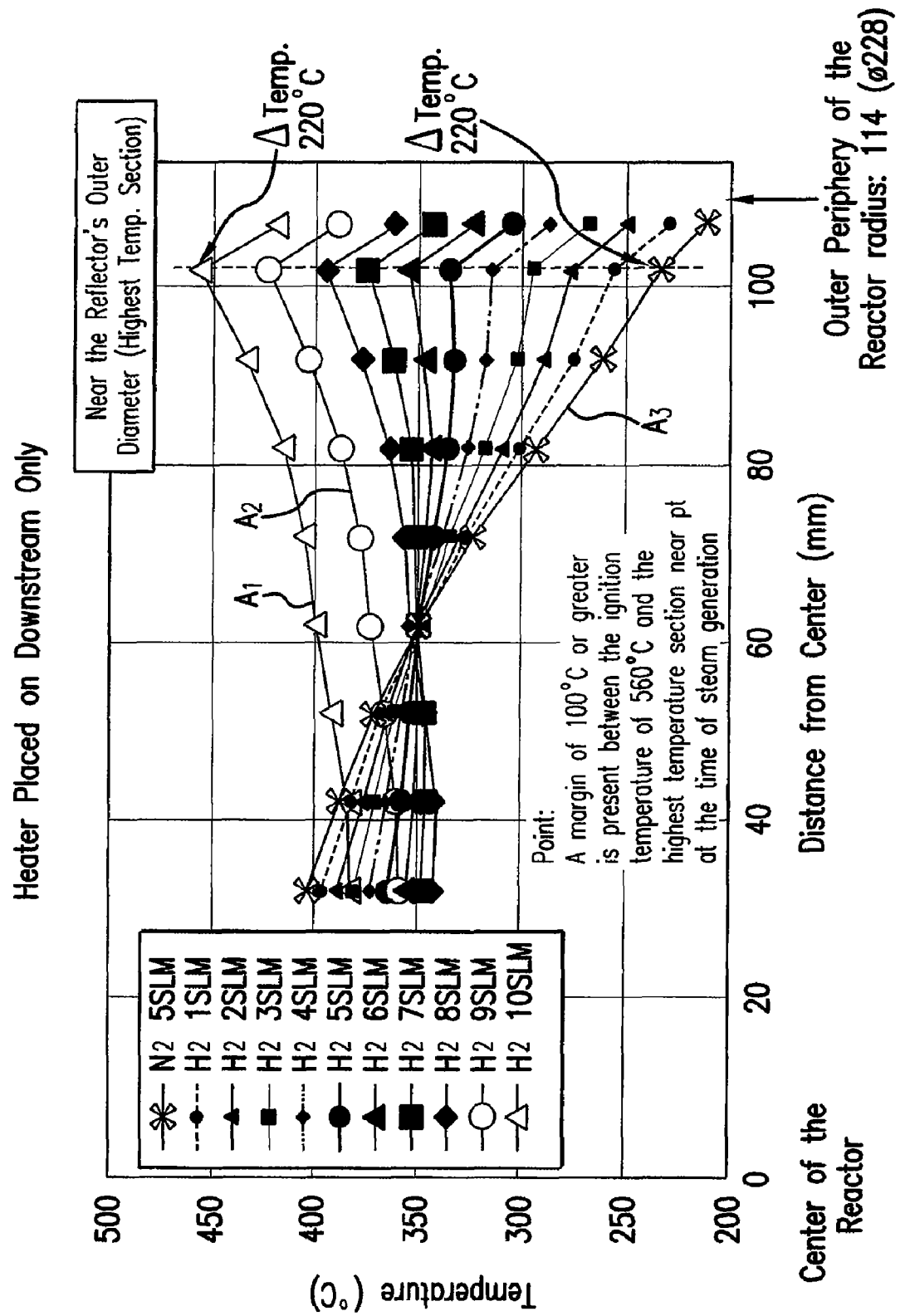
FIG. 11 is a diagram illustrating the temperature distribution (radial) in close proximity to the inner wall of the reactor structural component on the outlet side 2 with a reactor for generating moisture in Example 2 as shown in FIG. 7 to FIG. 9.

FIG. 11 shows the measurement results. Curve $A_1$ shows the case when the volume of moisture generated is 10 SLM, Curve $A_2$ shows the case when the volume of moisture generate is 9 SLM, and Curve A3 shows the case when only the $N_2$ gas is fed to the reactor A. At the time these measurements were collected, the cooling fan 18 of the temperature regulator B was brought to a halt, and the temperature of the plane-shaped heater 13 was set at 350° C.

The testing results shown in FIG. 11 reveal that the temperature (max temperature part) of the reactor structural component on the downstream side 2, at the position in the vicinity of the peripheral edge of the reflector 3*b* under conditions that the volume of moisture generated was 10 SLM, could be suppressed to approx 450° C.

Example 3

Figure 12:
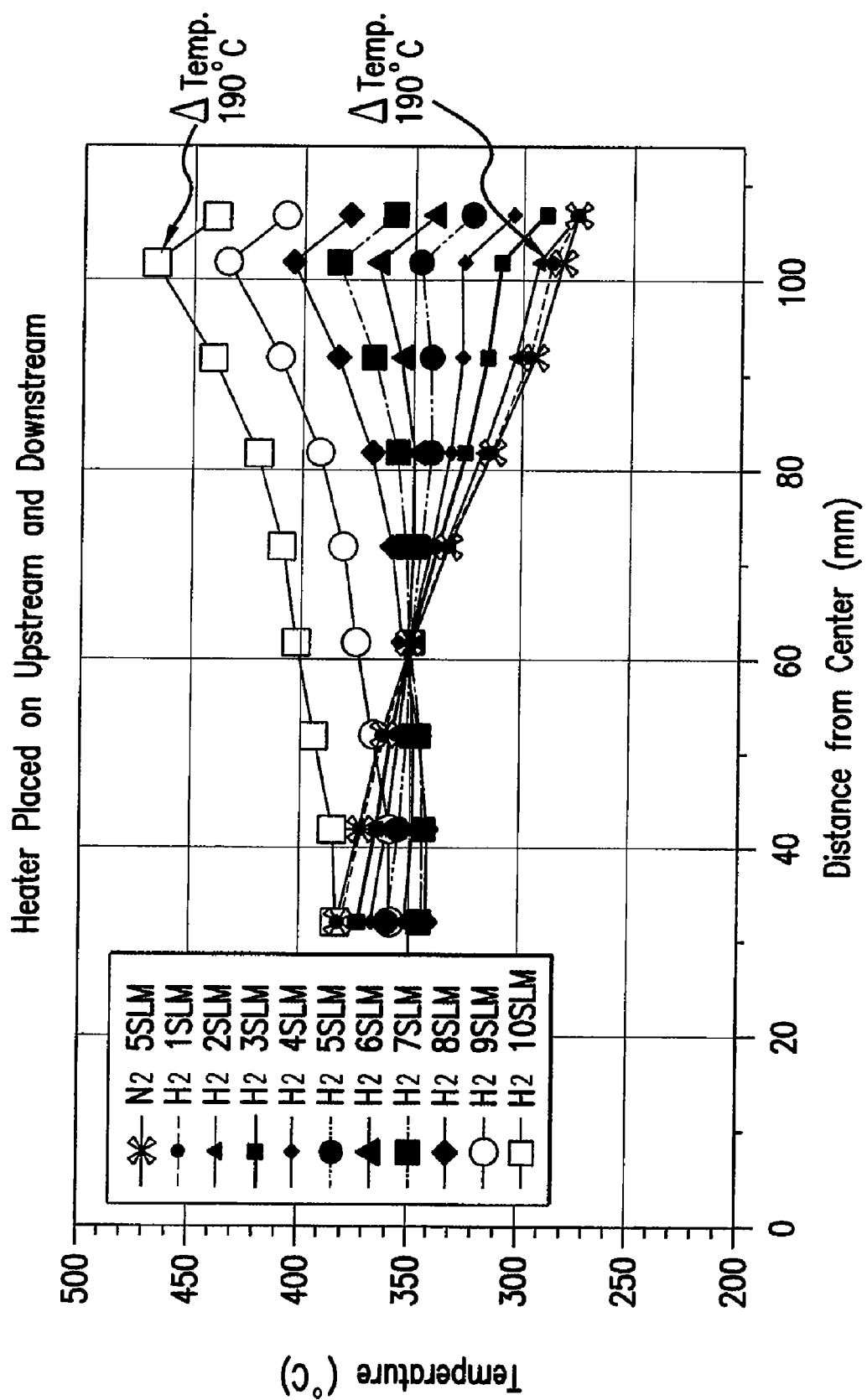
FIG. 12 is a diagram illustrating the afore-mentioned temperature distribution (radial) at the same position as that in FIG. 11 with the reactor for generating moisture in Example 3.

FIG. 12 shows, for the reactor A for generating moisture illustrated in FIG. 7 to FIG. 9, the results of measurements of the temperature distribution in a radial direction of the position in the vicinity of the inner surface of the reactor structural component on the outlet side 2 by making the volume of moisture generated a parameter. In accordance with the case in the afore-mentioned Example 2 in FIG. 11, under conditions wherein the cooler $15_1$ on the inlet side was removed, and the reactor A for generating moisture, which was constituted so that a round plane-shaped heater 13 having the outer diameter of 228 mm φ and the cooler 15 were employed and provided on the outer surface of the reactor structural component on the inlet side 1 as shown in FIG. 15. Also, the conditions of the afore-mentioned Example 2 in 11 included setting the temperature of both plane-shaped heaters 13 of the upstream side and downstream side at 350° C., and to halt the cooling fan 18.

As apparent from FIG. 12, the highest temperature observed with the volume of moisture generated of 10 SLM was approx 470° C., which is slightly higher than the case of Example 2.

Example 4

Figure 13:
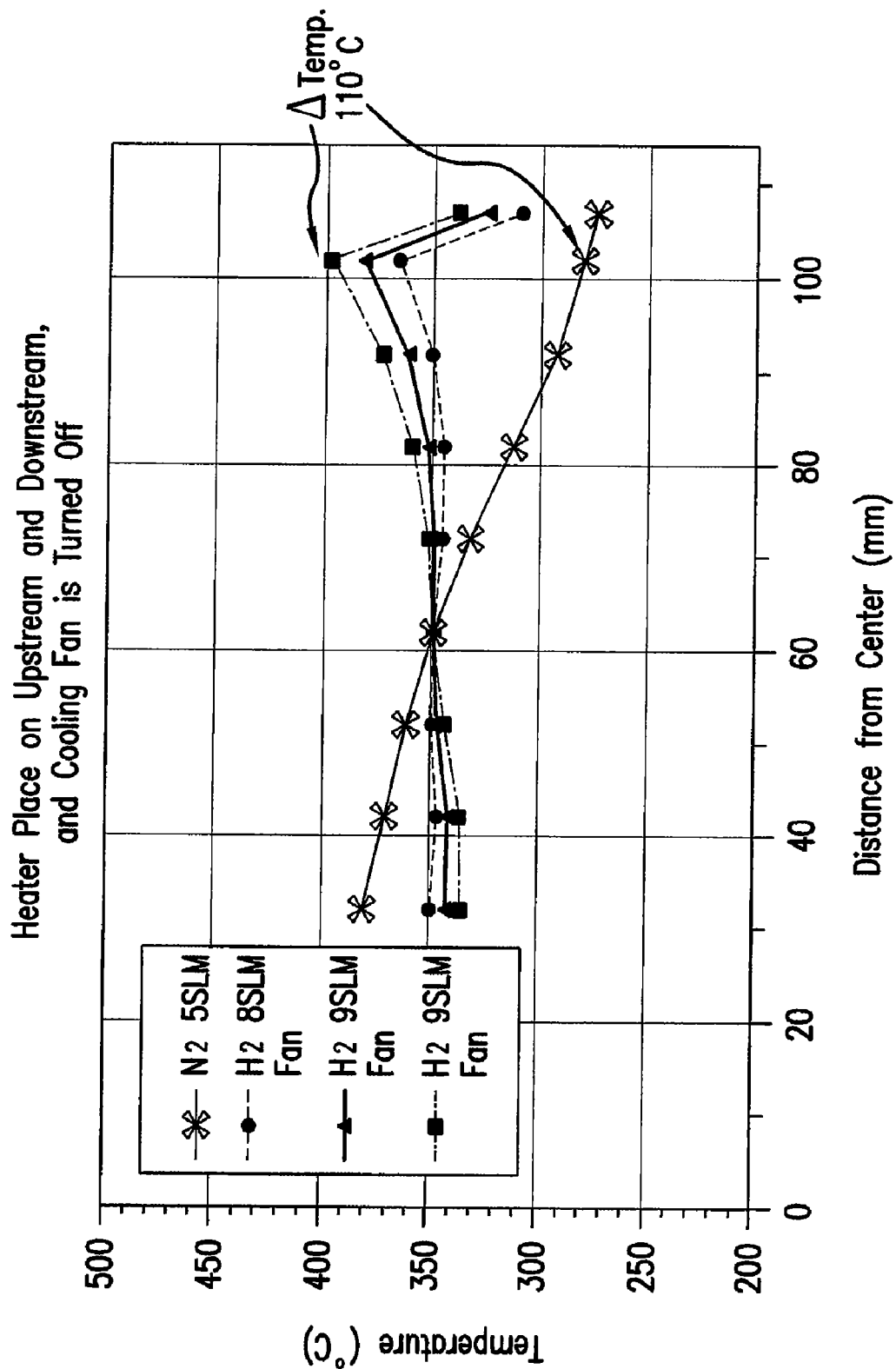
FIG. 13 is a diagram illustrating the afore-mentioned temperature distribution (radial) at the same position as that in FIG. 5 under conditions when a cooling fan is in operation with a reactor for generating moisture in Example 3.

FIG. 13 shows the temperature distribution in a radial direction in the vicinity of the inner surface of the reactor structural component on the outlet side 2 at the time when the cooling fan 18 is operated when using the same reactor for generating moisture as that of the afore-mentioned Example 3. The cooling fan 18 used in this embodiment has the same cooling capacity as that of the conventional reactor of 5 SLM shown in FIG. 15.

Figure 14:
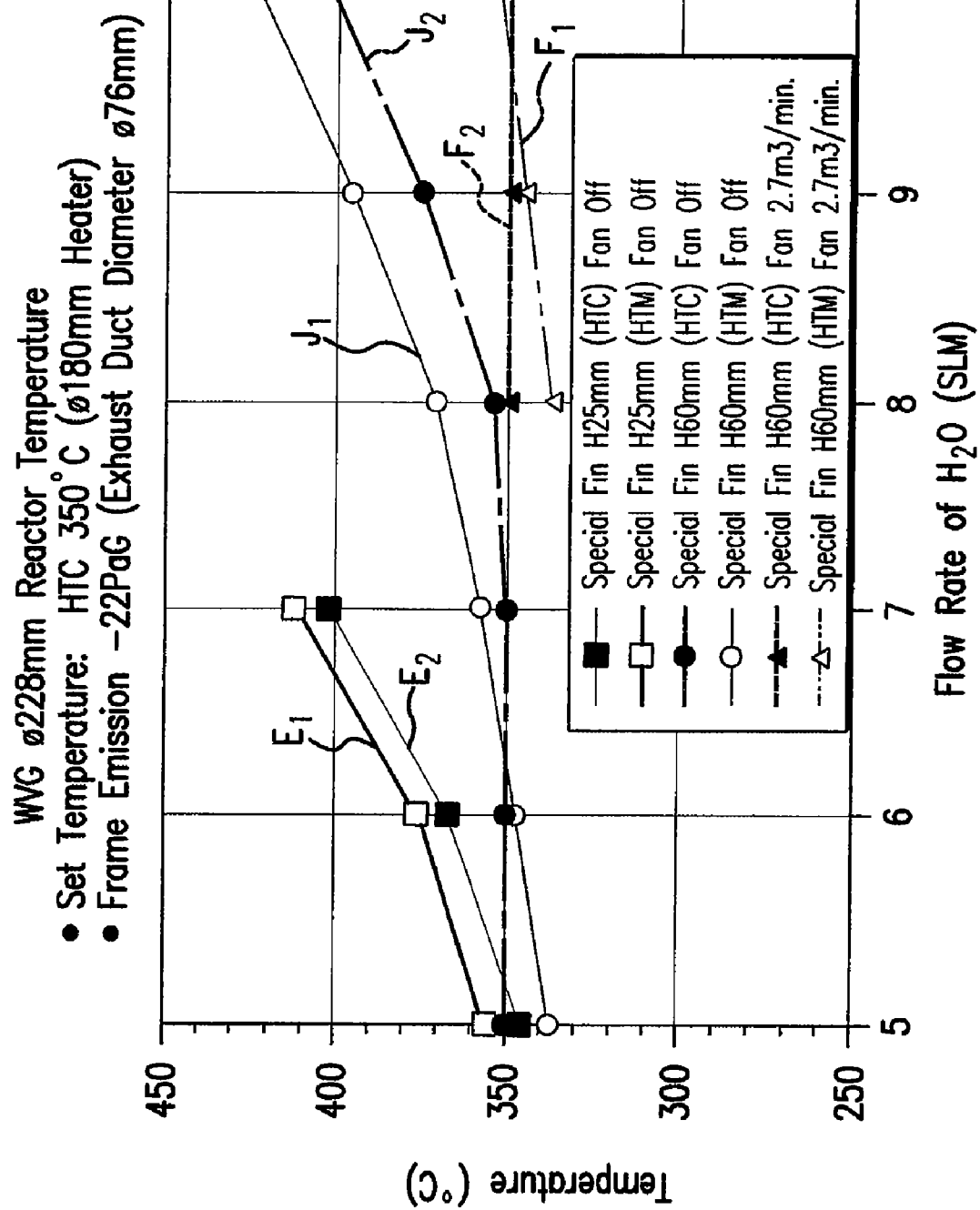
FIG. 14 is a diagram showing the relationship between the volume of moisture generated and the temperature, and the like, of a reactor when the height of the heat dissipation fin of a cooler is varied.

FIG. 14 shows, with the cooler $15_1$ on the inlet side and the cooler $15_2$ on the outlet side, as shown in FIG. 7 to FIG. 9, the relationship between the volume of moisture generated and the highest temperature in case where the height of the heat dissipation fin 15*a* was varied. Curve $E_1$ and Curve $E_2$ show the relationship between the volume of moisture generated and the temperature of the reactor structural component 2 ($E_1$ is the value measured by the thermometer for monitoring the temperature of the reactor and $E_2$ is the value detected by the thermometer for controlling a heater) when the height of heat dissipation fins 15*a* of the cooler $15_1$ on the inlet side and the cooler $15_2$ on the outlet side was 25 mm, respectively, and the cooling fan 18 was brought to a halt.

Curves $F_1$ and $F_2$ show the value measured by the thermometer for monitoring the temperature of the reactor in fixing hole 22 and the value measured by the thermometer for controlling a heater in fixing hole 21 in the case where the capacity of the cooling fan 18 is improved and the exhaust pressure inside the case constituting a reactor A for generating moisture is made −22 PaG (diameter of the exhaust duct is 76 mm φ and the displacement is 2.7 m/min). Furthermore, Curves $J_1$ and $J_2$ show the value measured by the thermometer for monitoring the temperature of the reactor in fixing hole 22 and the value measured by the thermometer for controlling a heater in fixing hole 21, respectively, in the afore-shown FIG. 9.

In accordance with the afore-mentioned embodiment in FIG. 7 to FIG. 9, a heater is made to be a disc- and plane-shaped heater. However, the shape of the heater can be triangular-shaped. In such a case, a triangular-shaped heater fixing hole 23 is to be made in the center of the heat dissipation body substrate 15*b* on the side of the cooler $15_2$ on the outlet side. In accordance w the present embodiment, the reactor A is constituted so that a plane-shaped heater 13 is attached to the outer surface of the reactor structural component on the outlet side 2 (or to the outer surfaces of both reactor structural components 1 and 2) from the outside. However, it is also possible that a plane-shaped heater 13 is imbedded in (or fitted into) the outermost layer part of the reactor structural component on the outlet side 2 (or the outermost layer parts of both reactor structural components 1 and 2).

Furthermore, it is also possible that a heat dissipation body substrate 15*b* of the cooler $15_1$ on the inlet side is made smaller in size so that it can be directly fixed to the outer surface of the inner side (center part) and a brim-shaped heater is fixed to the outside (peripheral edge) of the reactor structural component on the inlet side 1.

Figure 24:
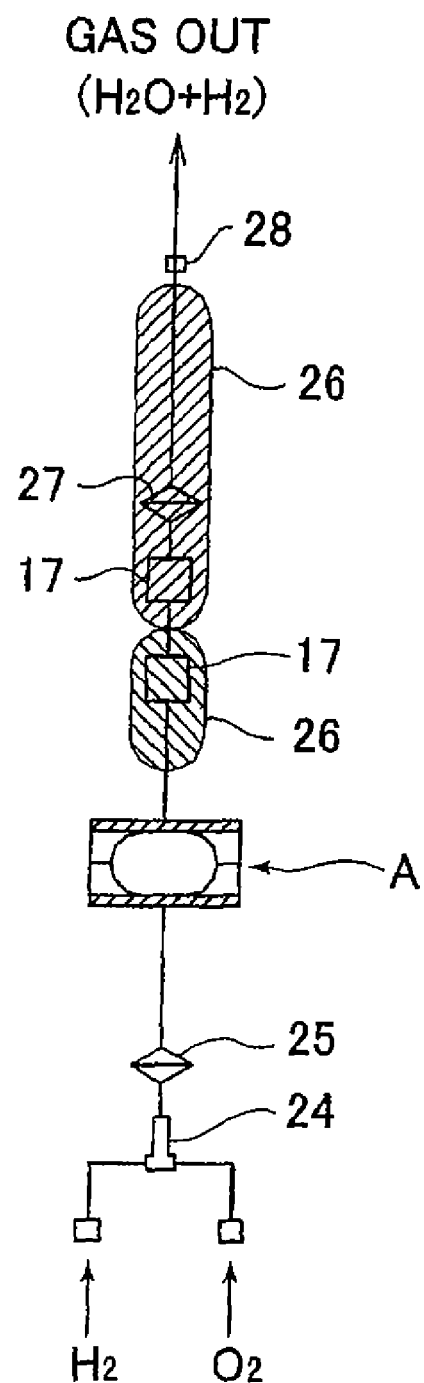
FIG. 24 is a flow diagram of a moisture generating and feeding apparatus in which a reactor A for generating moisture in the present invention is employed.
Figure 25:
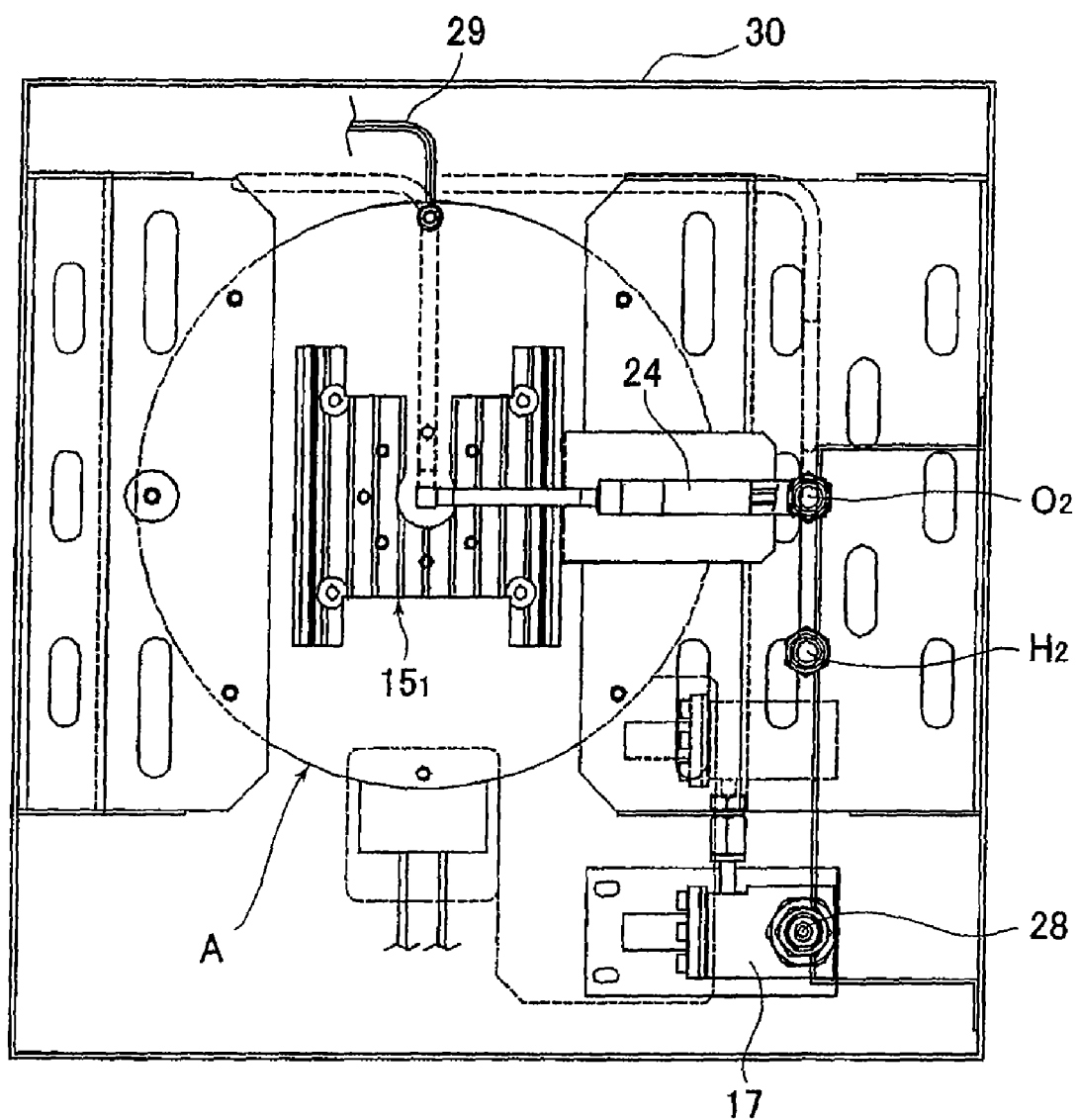
FIG. 25 is a plan schematic view of a moisture generating and feeding apparatus.
Figure 26:
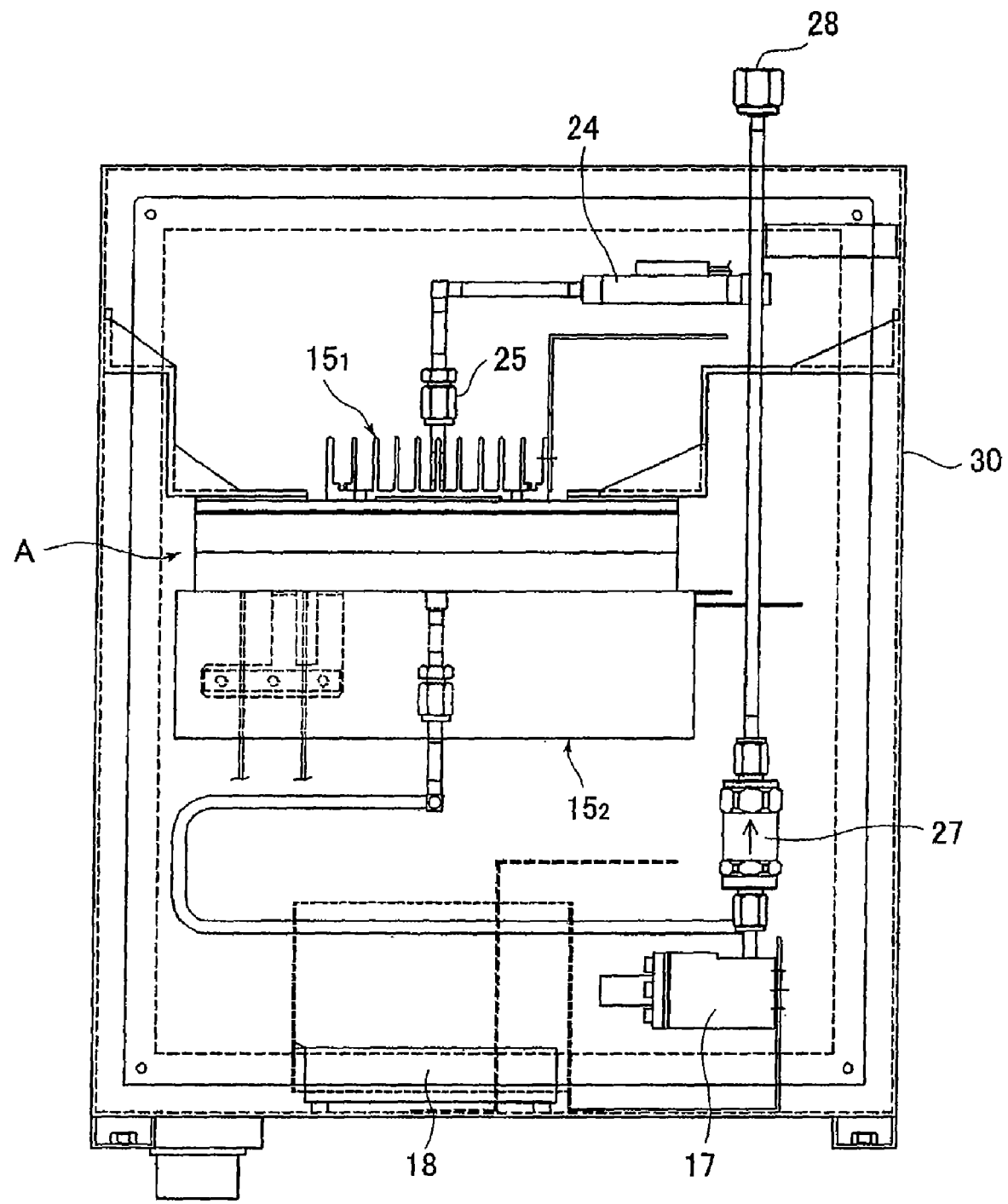
FIG. 26 is a longitudinal schematic view of a moisture generating and feeding apparatus.

FIG. 24 is a flow diagram of the moisture generating and feeding apparatus for which the reactor A, in accordance with the present invention, is employed. FIG. 25 is a plan schematic view of the moisture generating and feeding apparatus, and FIG. 26 is a longitudinal cross sectional schematic diagram of the moisture generating and feeding apparatus. In FIG. 24 to FIG. 26, A designates a reactor for generating moisture, $15_1$ designates a cooler on the inlet side, 17 designates a $H_2$ sensor, 18 designates a cooling fan, 24 designates a mixer, 25 designates a gas filter, 26 designates a heater in the pipe passage, 27 designates a filter, 28 designates a gas take-out port, 29 designates a lead wire for a heater, and 30 designates a case body. The flow diagram of the moisture generating and feeding apparatus is generally the same as the flow diagram of a conventional one. Therefore, the explanation is omitted herewith.

Figure 21:
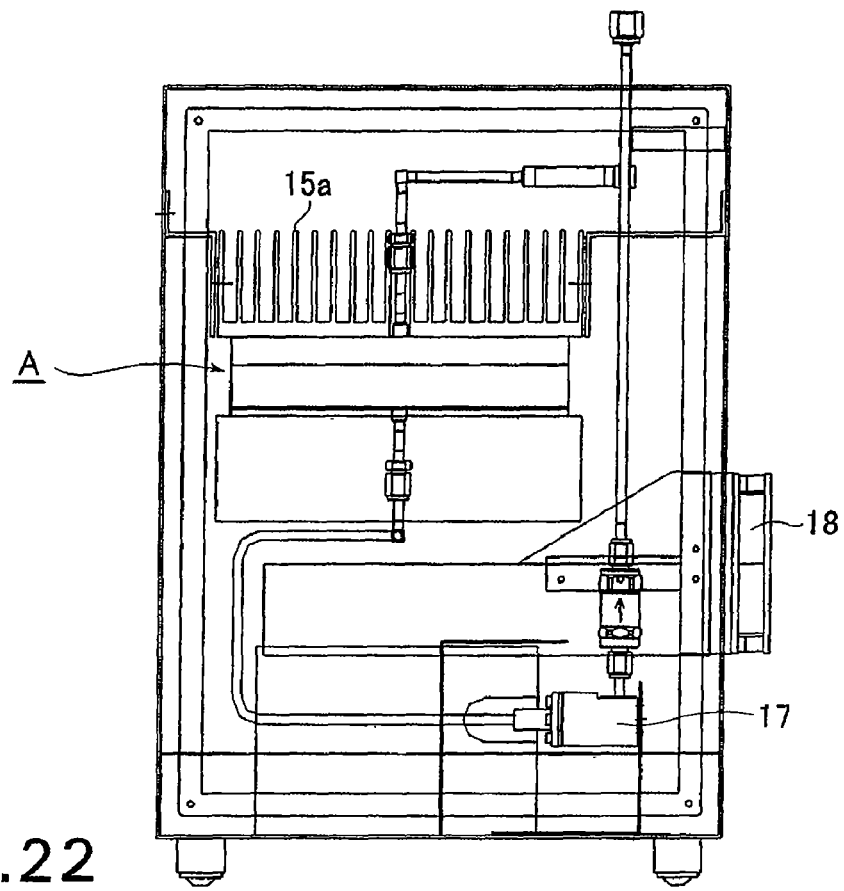
FIG. 21 is a longitudinal cross sectional schematic view of the moisture generating apparatus in which a reactor is incorporated.
Figure 22:
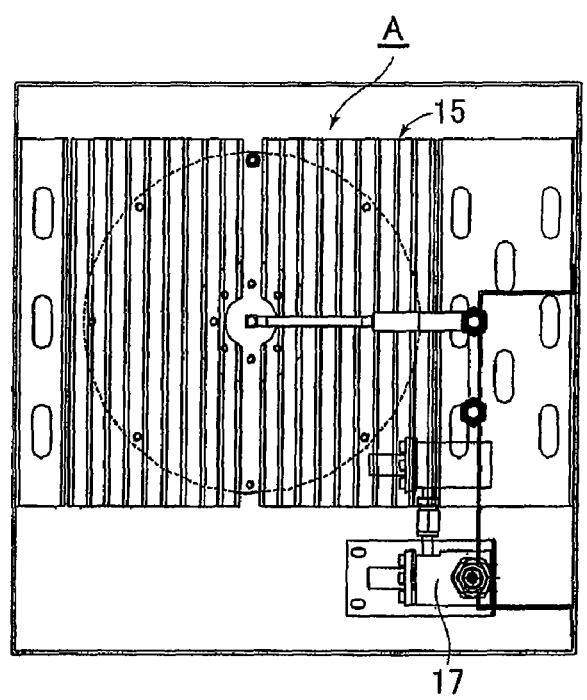
FIG. 22 is a plan view of the moisture generating apparatus of FIG. 21.
Figure 23:
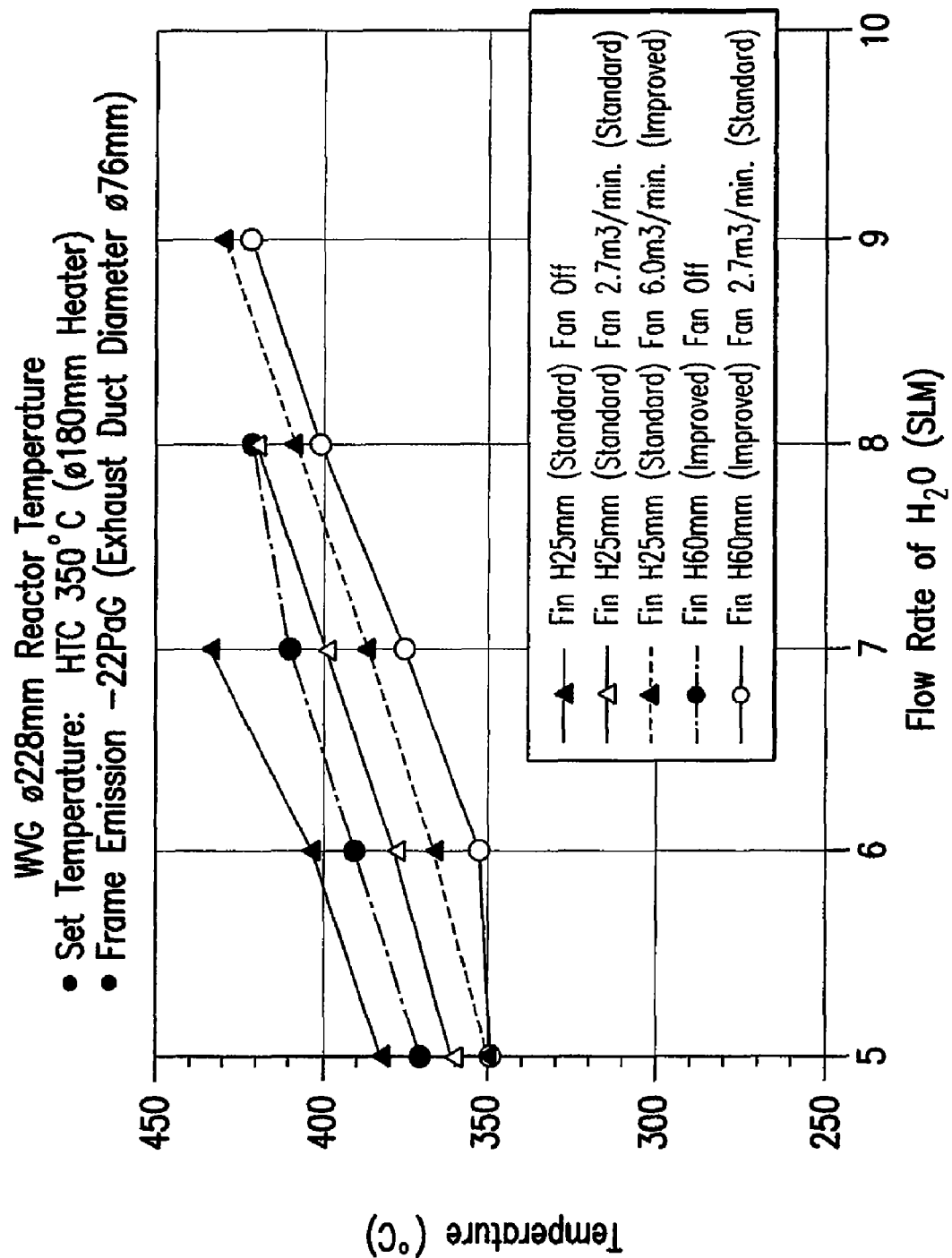
FIG. 23 is a diagram showing the relationship between the volume of moisture generated by using the reactor shown in FIG. 17 to FIG. 20 and the temperature of the reactor.

With the moisture generating and feeding apparatus in accordance with the present invention, the external dimensions of the case body are set to be 380 mm wide, 380 mm deep and 465 mm high. The width 380 mm and depth 380 mm are generally the same as those of a conventional moisture generating and feeding apparatus, but in the apparatus shown in FIG. 21 and FIG. 22 the height is approx 60 mm shorter. As stated before, the reactor A can generate the volume of moisture of 10 SLM under conditions of the highest temperature of 450° C. or less, and feed the volume of moisture approx 10 times the conventional one.

FEASIBILITY OF INDUSTRIAL USE

The present invention is mainly utilized as a moisture feeding apparatus for semiconductor manufacturing facilities, an apparatus to remove the hydrogen gas out of the hydrogen containing gas or a moisture feeding apparatus for chemical agent manufacturing facilities, and the like.

What is claimed is:
1. A reactor for generating moisture comprising:
  (a) a reactor structural component on an inlet side having a gas feed port and a reactor structural component on an outlet side having a moisture gas take-out port, wherein the reactor structural component on the inlet side and the reactor structural component on the outlet side are positioned against each other to define an interior space;
  (b) a first reflector placed oppositely to the gas feed port and a second reflector placed oppositely the moisture gas take-out port in the interior space of the reactor;

(c) a platinum coating catalyst layer formed on an inner wall face of the reactor structural component on the outlet side;

(d) at least one heater disposed to heat the reactor; and (e) at least one cooler fixed to an outer surface of the reactor to cool the reactor; wherein the reactor for generating moisture reacts hydrogen and oxygen under conditions of non-combustion by allowing hydrogen and oxygen fed from the gas feed port into the interior space of the reactor to contact with the platinum coating catalyst layer to activate reactivity, and the at least one cooler includes a cooler on the outlet side comprising i. a heat dissipation body substrate having a heater insertion hole in the center fixed to an outer surface of the reactor structural component on the outlet side; and ii. a plural number of heat dissipation bodies installed vertically in parallel on an area excluding a part where the heater insertion hole exists in the heat dissipation body substrate, and at least one heater inserted in the cooler on the outlet side so as to fix the heater to the outer surface of the reactor structural component on the outlet side.

2. A reactor for generating moisture comprising:

(a) a reactor structural component on an inlet side having a gas feed port and a reactor structural component on an outlet side having a moisture gas take-out port, wherein the reactor structural component on the inlet side and the reactor structural component on the outlet side are positioned against each other to define an interior space;

(b) a first reflector placed oppositely to the gas feed port and a second reflector placed oppositely the moisture gas take-out port in the interior space of the reactor;

(c) a platinum coating catalyst layer formed on an inner wall face of the reactor structural component on the outlet side;

(d) at least one heater disposed to heat the reactor; and (e) at least one cooler fixed to an outer surface of the reactor to cool the reactor; wherein the reactor for generating moisture reacts hydrogen and oxygen under conditions of non-combustion by allowing hydrogen and oxygen fed from the gas feed port into the interior space of the reactor to contact with the platinum coating catalyst layer to activate reactivity, and the at least one cooler includes a cooler on the outlet side and a cooler on the inlet side, wherein the cooler on the outlet side comprises i. a heat dissipation body substrate having a heater insertion hole in the center fixed to an outer surface of the reactor structural component on the outlet side; and ii. a plural number of heat dissipation bodies installed vertically in parallel on an area excluding a part where the heater insertion hole exists in the heat dissipation body substrate, and the cooler on the inlet side comprises i. a heat dissipation body substrate fixed to an outer surface of the reactor structural component on the inlet side; and ii. a plural number of heat dissipation bodies installed on the heat dissipation body substrate vertically in parallel.

3. A reactor for generating moisture as claimed in claim 1, wherein the reactor structural component on the inlet side is also provided with a heater.

4. A reactor for generating moisture as claimed in claim 2, wherein the height of the heat dissipation body of the cooler on the inlet side and the height of the heat dissipation body of the cooler on the outlet side are made to be the same height or the height of the heat dissipation body of the cooler on the outlet side is made higher than the height of the heat dissipation body of the cooler on the inlet side.

5. A reactor for generating moisture as claimed in claim 2, wherein the at least one heater includes a plane-shaped heater provided between the heat dissipation body substrate of the cooler on the inlet side and the outer surface of the reactor structural component on the inlet side.

6. A reactor for generating moisture as claimed in claim 2, wherein the heat dissipation body substrate of the cooler on the inlet side is directly fixed to the outer surface of an inner part of the reactor structural component on the inlet side, and the at least one heater includes a brim-shaped heater is directly fixed to the outer surface of the outer part of the reactor structural component on the inlet side.

7. A reactor for generating moisture as claimed in claim 2, wherein the heat dissipation body substrate of the cooler on the inlet side is fixed to the outer surface of the reactor structural component on the inlet side and positioned at an inner side part of a heater press fixed to the outer surface of the reactor structural component on the inlet side, and the at least one heater includes a heater fixed between the outer surface of the outside part of the reactor structural component on the inlet side and the heater press.

8. A reactor for generating moisture as claimed in claim 1, wherein the heat dissipation body substrate of the cooler on the outlet side is directly fixed to the outer surface of an outside part of the reactor structural component on the outlet side, and the at least one heater includes a heater directly fixed to the reactor structural component on the outlet side by inserting the heater into the heater insertion hole located on the cooler on the outlet side.

9. A reactor for generating moisture as claimed in claim 1, wherein each heat dissipation body is made to be a thin-plate-shaped heat dissipation fin or a rod-shaped heat dissipation pin.

10. A reactor for generating moisture as claimed in claim 2, wherein the outer surfaces of the reactor structural component on the inlet side and the reactor structural component on the outlet side are made to be round-shaped, and the heat dissipation body substrates of both coolers are made to be either round-shaped or square-shaped, and the heater insertion hole installed on the heat dissipation body substrate of the cooler on the outlet side is made to be round-shaped.

11. A reactor for generating moisture as claimed in claim 1, wherein the at least one heater is provided on a cylindrical face of the reactor.

12. A reactor for generating moisture as claimed in claim 1, wherein the at least one heater is made to be brim-shaped.

13. A moisture generating and feeding apparatus comprising a reactor for generating moisture as recited in claim 1.

14. A reactor for generating moisture as claimed in claim 2, wherein the reactor structural component on the inlet side is provided with a heater.

15. A reactor for generating moisture as claimed in claim 3, wherein the heat dissipation body substrate of the cooler on the inlet side is fixed to the outer surface of the reactor structural component on the inlet side and positioned at an inner side part of a heater press fixed to the outer surface of the reactor structural component on the inlet side, and the heater of the inlet side is fixed between the outer surface of the outside part of the reactor structural component on the inlet side and the heater press.

16. A reactor for generating moisture as claimed in claim 2, wherein the at least one heater is provided on a cylindrical face of the reactor.

17. A reactor for generating moisture as claimed in claim 2, wherein the at least one heater is made to be brim-shaped.

18. A moisture generating and feeding apparatus comprising a reactor for generating moisture as claimed in claim 2.

19. A reactor for generating moisture comprising:
(a) a reactor structural component on an inlet side having a gas feed port and a reactor structural component on an outlet side having a moisture gas take-out port, wherein the reactor structural component on the inlet side and the reactor structural component on the outlet side are positioned against each other to define an interior space;
(b) a reflector placed oppositely to the gas feed port in the interior space of the reactor;
(c) a platinum coating catalyst layer formed on an inner wall face of the reactor structural component on the outlet side;
(d) at least one heater disposed to heat the reactor; and
(e) at least one cooler fixed to an outer surface of the reactor to cool the reactor; wherein the reactor for generating moisture reacts hydrogen and oxygen under conditions of non-combustion by allowing hydrogen and oxygen fed from the gas feed port into the interior space of the reactor to contact with the platinum coating catalyst layer to activate reactivity, and the at least one cooler includes a cooler on the outlet side comprising
  i. a heat dissipation body substrate having a heater insertion hole in the center fixed to an outer surface of the reactor structural component on the outlet side; and
  ii. a plural number of heat dissipation bodies installed vertically in parallel on an area excluding a part where the heater insertion hole exists in the heat dissipation body substrate, and the at least one heater includes a heater inserted in the cooler on the outlet side so as to fix the heater to the outer surface of the reactor structural component on the outlet side.

20. A reactor for generating moisture comprising:
(a) a reactor structural component on an inlet side having a gas feed port and a reactor structural component on an outlet side having a moisture gas take-out port, wherein the reactor structural component on the inlet side and the reactor structural component on the outlet side are positioned against each other to define an interior space;
(b) a reflector placed oppositely to the gas feed port in the interior space of the reactor;
(c) a platinum coating catalyst layer formed on an inner wall face of the reactor structural component on the outlet side;
(d) at least one heater disposed to heat the reactor; and
(e) at least one cooler fixed to an outer surface of the reactor to cool the reactor; wherein the reactor for generating moisture reacts hydrogen and oxygen under conditions of non-combustion by allowing hydrogen and oxygen fed from the gas feed port into the interior space of the reactor to contact with the platinum coating catalyst layer to activate reactivity, and the at least one cooler includes a cooler on the outlet side and a cooler on the inlet side, wherein the cooler on the outlet side comprises
  i. a heat dissipation body substrate having a heater insertion hole in the center fixed to an outer surface of the reactor structural component on the outlet side; and
  ii. a plural number of heat dissipation bodies installed vertically in parallel on an area excluding a part where the heater insertion hole exists in the heat dissipation body substrate, and
the cooler on the inlet side comprises
  i. a heat dissipation body substrate fixed to an outer surface of the reactor structural component on the inlet side; and
  ii. a plural number of heat dissipation bodies installed on the heat dissipation body substrate vertically in parallel.

* * * * *